United States Patent
Miyano et al.

(10) Patent No.: US 8,145,175 B2
(45) Date of Patent: Mar. 27, 2012

(54) SAMPLING FILTER APPARATUS

(75) Inventors: Kentaro Miyano, Osaka (JP);
Yoshifumi Hosokawa, Osaka (JP);
Katsuaki Abe, Kanagawa (JP); Noriaki Saito, Tokyo (JP); Kiyomichi Araki, Saitama (JP)

(73) Assignee: Panasonic Corporation, Osaka (JP)

( * ) Notice: Subject to any disclaimer, the term of this patent is extended or adjusted under 35 U.S.C. 154(b) by 139 days.

(21) Appl. No.: 12/680,326

(22) PCT Filed: Sep. 25, 2008

(86) PCT No.: PCT/JP2008/002667
§ 371 (c)(1),
(2), (4) Date: Apr. 20, 2010

(87) PCT Pub. No.: WO2009/041047
PCT Pub. Date: Apr. 2, 2009

(65) Prior Publication Data
US 2010/0201424 A1    Aug. 12, 2010

(30) Foreign Application Priority Data
Sep. 27, 2007    (JP) ................................ P2007-252367

(51) Int. Cl.
*H04B 1/10*    (2006.01)
(52) U.S. Cl. ........... 455/307; 375/350; 327/91; 327/554
(58) Field of Classification Search .................. 455/307, 455/339; 375/229, 232, 350; 327/91, 552, 327/553, 554, 558
See application file for complete search history.

(56) References Cited

U.S. PATENT DOCUMENTS

| | | | | |
|---|---|---|---|---|
| 4,429,406 A | * | 1/1984 | Hale | 375/364 |
| 6,225,795 B1 | * | 5/2001 | Stratakos et al. | 323/283 |
| 7,289,555 B2 | * | 10/2007 | Hidaka | 375/229 |
| 2003/0035499 A1 | | 2/2003 | Staszewski et al. | |
| 2003/0040294 A1 | | 2/2003 | Staszewski et al. | |
| 2003/0080888 A1 | | 5/2003 | Muhammad et al. | |
| 2003/0083033 A1 | | 5/2003 | Staszewski et al. | |
| 2003/0083035 A1 | | 5/2003 | Staszewski et al. | |
| 2003/0083852 A1 | | 5/2003 | Muhammad et al. | |

(Continued)

FOREIGN PATENT DOCUMENTS

JP    2004-289739 A    10/2004

(Continued)

OTHER PUBLICATIONS

International Search Report for PCT/JP2008/02667.

*Primary Examiner* — Quochien B Vuong
(74) *Attorney, Agent, or Firm* — Pearne & Gordon LLP

(57) ABSTRACT

The sampling filter apparatus 100 includes the first sampling switch 130, the second sampling switch 131, the first integrator 1500 for integrating the charge input from the first sampling switch, the second integrator 1501 for integrating the charge input from the second sampling switch, a plurality of integrators connected to both of the first integrator and the second integrator via a charging switch, respectively, the control section 140, a plurality of charging switches, and a plurality of discharge switches. A charge input from the sampling switch 130, a charge accumulated in the capacitor 1500 and a charge accumulated in a capacitor 1510 are shared by the capacitor 1500, the capacitor 1510 and the capacitor 1530, and the charge accumulated in the capacitor 1530 is output.

12 Claims, 14 Drawing Sheets

U.S. PATENT DOCUMENTS

| | | |
|---|---|---|
| 2005/0025268 A1 | 2/2005 | Muhammad et al. |
| 2005/0025269 A1 | 2/2005 | Muhammad et al. |
| 2005/0025270 A1 | 2/2005 | Muhammad et al. |
| 2005/0130618 A1 | 6/2005 | Staszewski et al. |
| 2006/0135107 A1 | 6/2006 | Staszewski et al. |
| 2009/0009155 A1 | 1/2009 | Hosokawa et al. |

FOREIGN PATENT DOCUMENTS

| | | |
|---|---|---|
| WO | 2007/102459 A1 | 9/2007 |

* cited by examiner

200: WIRELESS COMMUNICATION APPARATUS

300: WIRELESS COMMUNICATION APPARATUS

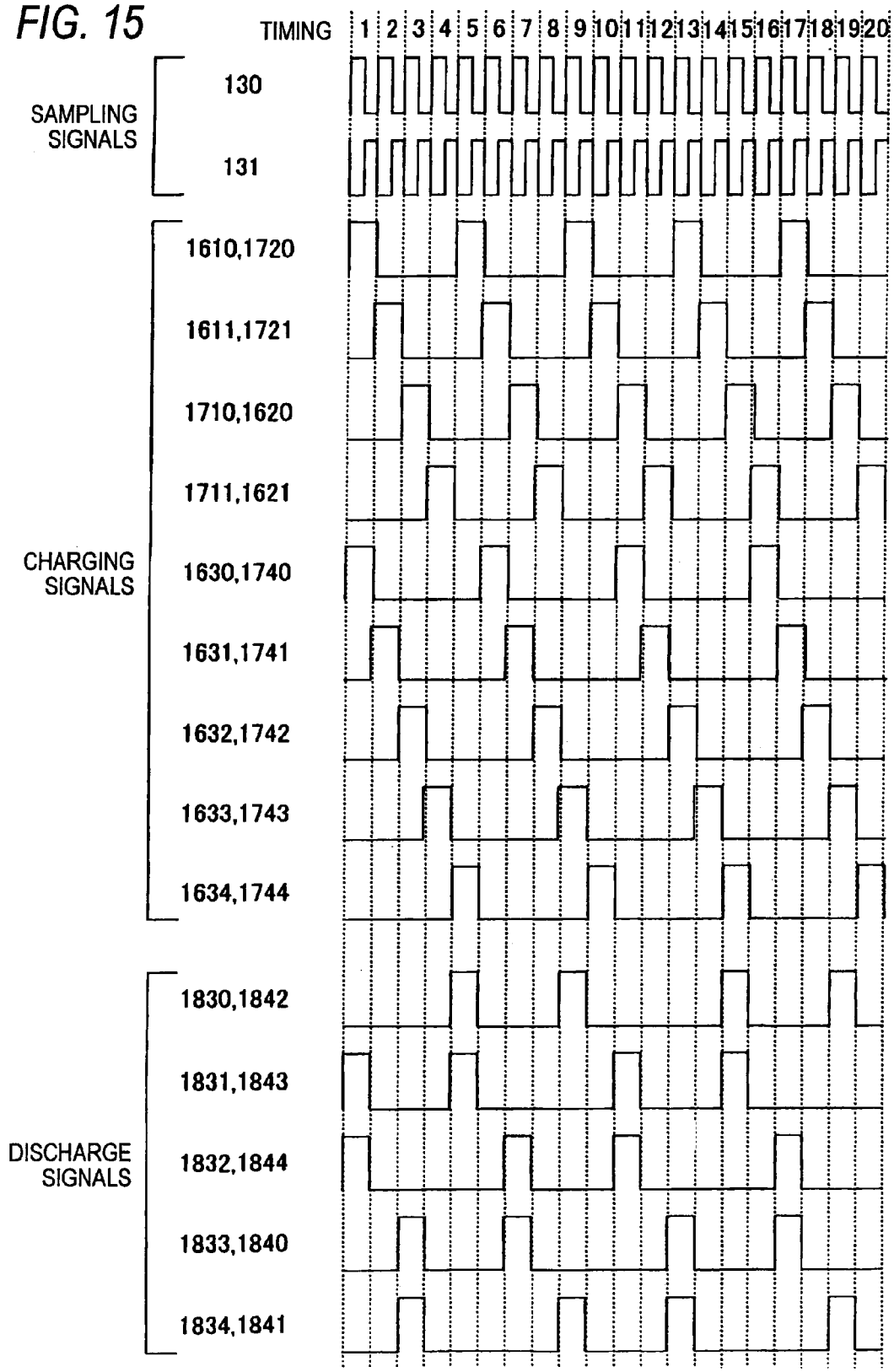

SAMPLING FILTER APPARATUS

TECHNICAL FIELD

The present invention relates to a sampling filter apparatus.

BACKGROUND ART

In a wireless communication apparatus such as mobile communications, a sampling filter apparatus that discretizes signals in terms of time, and carries out frequency conversion and filtering has been used. As a prior art sampling filter apparatus, for example, there was such an apparatus as disclosed in Patent Document 1. FIG. 10 shows the prior art sampling filter apparatus described in Patent Document 1.

In FIG. 10, the prior art sampling filter apparatus includes a mutual conductance amplifier 305, a history capacitor 307, rotating capacitors 308 and 309, switches 312, 314 and 315, and a digital control unit 317. The switches 312, 314 and 315 are controlled by signals generated by the digital control unit 317. An RF current output from the mutual conductance amplifier 305 is accumulated in the history capacitor 307, rotating capacitors 308 and 309, and a discrete-time sample stream is produced by cyclically reading the charge accumulated in the rotating capacitors 308 and 309. When resetting the charge accumulated in the rotating capacitors 308 and 309, an IIR filtering action is brought about.

Patent Document 1: JP-A-2004-289793 (Page 15, FIG. 3a)

DISCLOSURE OF THE INVENTION

Problem to be Solved by the Invention

However, in the prior art method described in Patent Document 1 described above, the action of the IIR filtering is first-order, wherein the control range of filtering characteristics is restricted. In addition, although it is possible to form an analog circuit having high-order filtering characteristics by providing history capacitors according to Patent Document 1 in parallel to each other, a transmission function will be expressed by only a positive coefficient, wherein there is a problem that the control range of filtering characteristics will not change much. Further, where filtering characteristics equivalent to a high-order IIR filtering action are achieved by using a rotating capacitor, it becomes necessary to prepare a great number of rotating capacitors, wherein there is another problem in that the circuit scale is remarkably increased.

It is therefore an object of the invention to provide a sampling filter apparatus that can achieve high-order filtering characteristics including a negative coefficient as a transmission function of a filter capable of carrying out IIR filtering actions.

Means for Solving the Problem

The present invention provides a sampling filter apparatus including the first sampling switch for sampling an input current, the second sampling switch having 180 degrees as a difference in phase from the first sampling switch with respect to ON time, the first integrator for integrating a charge input from the first sampling switch, a plurality of third integrators, a plurality of second integrators for integrating a charge input from the second sampling switch, charging switches connected to the second integrators, charging switches and discharge switches which are connected to the third integrators, and a control section for controlling the respective switches, wherein the charge input from the first sampling switch, a charge accumulated in the first integrator, and the charge accumulated in the second integrators are shared by the first integrator, the second integrators and the third integrators, and the charge accumulated in the third integrators is controlled so as to be output.

According to the configuration, it becomes possible to secure a high-order filtering action including a negative coefficient as a transmission function of a filter capable of carrying out IIR filter actions.

In addition, the above-described sampling filter apparatus further includes a fourth integrator for integrating a charge input from the second sampling switch, a plurality of sixth integrators, and a plurality of fifth integrators for integrating a charge input from the first sampling switch, wherein the charge input from the second sampling switch, the charge accumulated in the fourth integrator, and the charge accumulated in the fifth integrators are shared by the fourth integrator, the fifth integrators and the sixth integrators, and output from the sixth integrators and output from the third integrators are differentially composed.

According to the configuration, it is possible to increase the output gain in addition to securing a high-order filtering action including a negative coefficient as a transmission function of a filter capable of carrying out IIR filtering actions.

Further, the sampling filter apparatus controls so that the second integrators integrate the charge input from the first sampling switch and the fifth integrators integrate the charge input from the second sampling switch.

According to the configuration, it becomes possible to optimize the number of integrators when securing a high-order filtering action including a negative coefficient as a transmission function of a filter of IIR filtering actions.

Also, the above-described sampling filter apparatus includes the first sampling switch for outputting a positive charge by sampling an input current, the second sampling switch for outputting a negative charge by sampling an input current, the first capacitor for integrating the positive charge input from the first sampling switch, the second capacitor for integrating the negative charge input from the second sampling switch, the first integration unit having a plurality of capacitors connected to both of the first capacitor and the second capacitor via charging switches, the second integration unit having a plurality of capacitors connected to both of the first capacitor and the second capacitor via respective charging switches, the first integration/discharge unit having a plurality of capacitors connected to the first capacitor via charging switches, the second integration/discharge unit having a plurality of capacitors connected to the second capacitor via charging switches, discharge switches for discharging the charge accumulated in the first integration/discharge unit and the second integration/discharge unit, and a control unit for generating signals to control the first sampling switch, the second sampling switch, the charging switches and the discharge switches, respectively, wherein the difference in phase between the signal for controlling the first sampling switch and the signal for controlling the second sampling switch is 180 degrees, and the charge input from the first sampling switch, the charge already accumulated in the first capacitor, the charge already accumulated in at least one capacitor selected from a plurality of capacitors included in the first and the second integration units are shared by the first capacitor, at least one capacitor selected above, and at least one capacitor included in the first integration/discharge unit, the charge accumulated in a capacitor differing from the capacitor sharing the above-described charge of a plurality of capacitors included in the first integration/discharge unit and the charge accumulated in at least one capacitor included in the second integration/discharge unit are composed at the same timing as the sharing of the above-described charges, and are output via the discharge switch.

According to the configuration, since a plurality of capacitors connected to both a positive charge and a negative charge are included, it becomes possible to achieve high-order IIR filtering characteristics having a negative coefficient with a simplified structure.

In addition, in the above-described sampling filter apparatus, the charge input from the second sampling switch, the charge already accumulated in the second capacitor, and the charge already accumulated in at least one capacitor selected from a plurality of capacitors included in the first and the second integration units are shared by the second capacitor, at least one capacitor selected above, and at least one capacitor included in the second integration/discharge unit, the charge accumulated in a capacitor differing from the capacitor sharing the above-described charges of a plurality of capacitors included in the second integration/discharge unit, and the charge accumulated in at least one capacitor included in the first integration/discharge unit are composed at the same timing as the sharing of the charges, and are output via the discharge switch.

Also, the sampling filter apparatus repeats sharing of the above-described charges and composition thereof while varying combinations of capacitors connected to the first capacitor and the second capacitor for respective timing.

Further, in the sampling filter apparatus, where the charge already accumulated in at least one capacitor selected from a plurality of capacitors included in the first and the second integration units is a positive charge at the timing of sharing of the charges, the charging switch is controlled so that the selected capacitor is connected to the second capacitor, and where the charge already accumulated in at least one capacitor selected from a plurality of capacitors included in the first and the second integration units is a negative charge, the charging switch is controlled so that the selected capacitor is connected to the first integrator.

Also, a wireless communication apparatus of the present invention includes any one of the sampling filter apparatuses described above, a buffer section for converting the charge output from the inside of the sampling filter apparatus to voltage values and outputting the same, an A/D section for digitalizing analog signals output from the buffer section, and a base band section for demodulating the signals digitalized in the A/D section.

According to the configuration, it becomes possible to achieve a wireless communication apparatus using a high-order sampling filter including a negative coefficient as a transmission function of a filter capable of carrying out IIR filtering actions.

In addition, the present invention provides a sampling filter apparatus that includes the first sampling switch for outputting a positive charge by sampling an input current, the second sampling switch for outputting a negative charge by sampling an input current, the first capacitor for integrating the positive charge input from the first sampling switch, the second capacitor for integrating the negative charge input from the second sampling switch, the first integration unit having a plurality of capacitors connected to both of the first capacitor and the second capacitor via charging switches, the second integration unit having a plurality of capacitors connected to both of the first capacitor and the second capacitor via respective charging switches, the first integration/discharge unit having a plurality of capacitors connected to the first capacitor via charging switches, the second integration/discharge unit having a plurality of capacitors connected to the second capacitor via charging switches, discharge switches for discharging the charge accumulated in the first integration/discharge unit and the second integration/discharge unit, and a control unit for generating signals to control the first sampling switch, the second sampling switch, the charging switches and the discharge switches, respectively, wherein the difference in phase between the signal for controlling the first sampling switch and the signal for controlling the second sampling switch is 180 degrees, and the charge input from the first sampling switch, the charge already accumulated in the first capacitor, the charge already accumulated in at least one capacitor selected from a plurality of capacitors included in the first and the second integration units are shared by the first capacitor, at least one capacitor selected above, and at least one capacitor included in the first integration/discharge unit, and the charge accumulated in at least one capacitor of capacitors differing from the capacitors sharing the above-described charge and the charge accumulated in at least one capacitor included in the second integration/discharge unit are composed, and are output via the discharge switch.

According to the configuration, it is possible to provide a sampling filter apparatus, which has a wide control range of filtering characteristics, capable of using a negative coefficient as a transmission function of a filter and achieving a high-order transmission function, by a comparatively small-sized circuit configuration.

Further, in the above-described sampling filter apparatus, the charge input from the second sampling switch, the charge already accumulated in the second capacitor, and the charge already accumulated in at least one capacitor selected from a plurality of capacitors included in the first and the second integration units are shared by the second capacitor, at least one capacitor selected above, and at least one capacitor included in the second integration/discharge unit, the charge accumulated in at least one capacitor of capacitors differing from the capacitor sharing the above-described charge of a plurality of capacitors included in the second integration/discharge unit and the charge accumulated in at least one capacitor included in the first integration/discharge unit are composed, and are output via the discharge switch.

In addition, in the sampling filter apparatus, the charge is output at timings obtained by thinning the timings sharing the charge.

Effects of the Invention

According to the sampling filter apparatus pertaining to the present invention, a sampling filter apparatus, which has a wide range of filtering characteristics, capable of achieving an analog circuit having high-order filtering characteristics including a negative coefficient as a transmission function of a filter can be provided.

BRIEF DESCRIPTION OF THE DRAWINGS

FIG. 15 is a view showing a control signal of a control section in Embodiment 6 according to the present invention.

Figure 1:
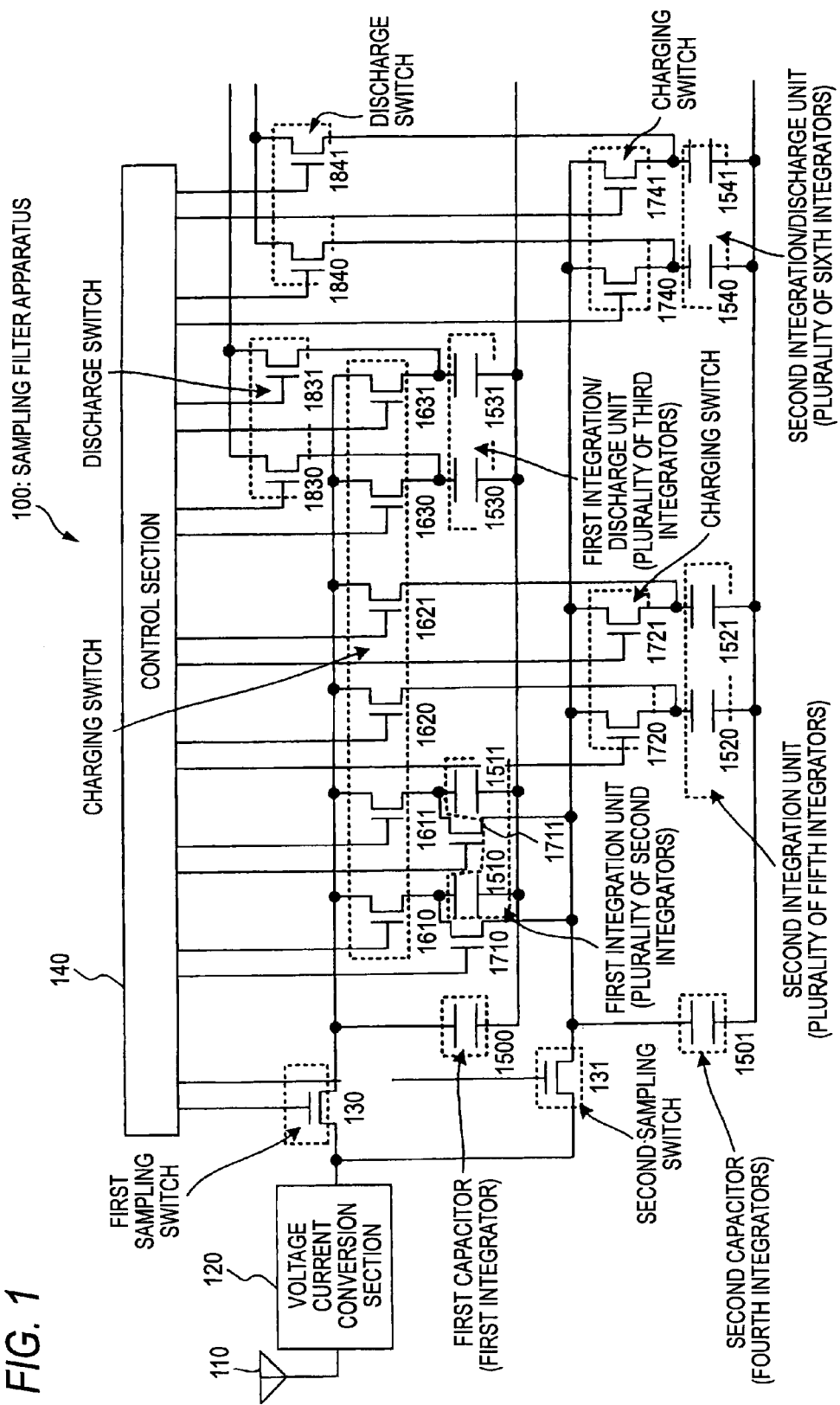
FIG. 1 is a block diagram showing a configuration of a sampling filter apparatus in Embodiment 1 according to the present invention.

DESCRIPTION OF REFERENCE NUMERALS 100, 201, 301, 400, 500, 600 Sampling filter apparatuses
110 Antenna
120 Voltage/current conversion section
130, 131 Sampling switches
1610, 1611, 1620, 1621, 1630, 1631, 1632, 1633, 1634, 1650, 1651, 1652, 1660, 1661, and 1662 Charging switches
1710, 1711, 1720, 1721, 1740, 1741, 1742, 1743, 1744, 1750, 1751, 1752, 1760, 1761, 1762 Charging switches
1830, 1831, 1832, 1833, 1834, 1840, 1841, 1842, 1843, 1844 Discharge switches
200, 300 Wireless communication apparatuses
202, 302 Buffer sections
203, 303 Differential composition sections
204, 304 A/D sections
205, 305, 306 Base band sections
307 Switch

BEST MODE FOR CARRYING OUT THE INVENTION

Hereinafter, a description is given of embodiments of the present invention with reference to the drawings.

Embodiment 1

FIG. 1 is a block diagram showing a configuration of a sampling filter apparatus in Embodiment 1 according to the present invention. In the present embodiment, a description is given of a case where the sampling filter apparatus has two-dimensional IIR filtering characteristics.

In FIG. 1, a sampling filter apparatus 100 includes an antenna 110, a voltage current conversion section 120, the first sampling switch 130, the second sampling switch 131, a control section 140, the first capacitor (corresponding to the first integrator of Claims 1 to 3) 1500, the second capacitor (the fourth integrator) 1501, capacitors which serve as the first integration unit (a plurality of second integrators) 1510 and 1511, capacitors 1520 and 1521 which serve as the second integration unit (a plurality of fifth integrators), capacitors 1530 and 1531 which serve as the first integration/discharge unit (a plurality of third integrators), capacitors 1540 and 1541 which serve as the second integration/discharge unit (a plurality of sixth integrators), charging switches 1610 and 1611, charging switches 1620 and 1621, charging switches 1630 and 1631, charging switches 1720 and 1721, charging switches 1740 and 1741, charging switches 1830 and 1831, and charging switches 1840 and 1841.

Here, a characteristic point resides in that the respective capacitors 1510, 1511, 1520 and 1521 which serve as the first integration unit and the second integration unit are connected to both of the capacitors 1500 and 1501 via charging switches.

The antenna 110 receives wireless frequency signals of a wireless system. Although not illustrated in FIG. 1, a wireless frequency signal received by the antenna 110 is subjected to high-frequency signal processing corresponding to the wireless system such as, for example, a filter, and is input into the voltage current conversion section 120. The voltage current conversion section 120 converts voltage input signals to a current and outputs the same. For example, the voltage current conversion section 120 is a transconductance amplifier.

The sampling switches 130 and 131 sample a current output from the voltage current conversion section 120 based on a signal input from the control section 140 and output the same to the capacitors 1500 and 1501, capacitors 1510 and 1511, capacitors 1520 and 1521, capacitors 1530 and 1531, and capacitors 1540 and 1541. Here, the phase of a control signal of the sampling switch 130 is deviated by 180 degrees from that of the sampling switch 131, wherein when the charge charged in the respective capacitors via the sampling switch 130 is positive, the charge charged in the respective capacitors via the sampling switch 131 becomes negative.

First, a description is given of the capacitor 1500. When the sampling switch 130 is turned ON, and the charging switches 1610 and 1630 are turned ON, the capacitor 1500 shares the charge input from the voltage current conversion section 120, the charge remaining in the capacitor 1500, and the charge remaining in the capacitor 1511 along with the capacitor 1510 and capacitor 1530. When the sampling switch 130 is turned ON, and the charging switches 1611 and 1631 are turned ON, the capacitor 1500 shares the charge input from the voltage current conversion section 120, the charge remaining in the capacitor 1500, and the charge remaining in the capacitor 1511 along with the capacitor 1511 and capacitor 1531. When the sampling switch 130 is turned ON, the charging switches 1620 and 1630 are turned ON, the capacitor 1500 shares the charge input from the voltage current conversion section 120, the charge remaining in the capacitor 1500 and the charge remaining in the capacitor 1520 along with the capacitor 1520 and the capacitor 1530. When the sampling switch 130 is turned ON, and the charging switches 1621 and 1631 are turned ON, the capacitor 1500 shares the charge input from the voltage current conversion section 120, the charge remaining in the capacitor 1500, and the charge remaining in the capacitor 1521 along with the capacitor 1521 and the capacitor 1531.

Next, a description is given of the capacitor 1501. When the sampling switch 131 is turned ON, and the charging switches 1720 and 1740 are turned ON, the capacitor 1501 shares the charge input from the voltage current conversion section 120, the charge remaining in the capacitor 1501, and the charge remaining in the capacitor 1520 along with the capacitors 1520, and the capacitor 1540. When the sampling switch 131 is turned ON, and the charging switches 1721 and 1741 are turned ON, the capacitor 1501 shares the charge input from the voltage current conversion section 120, the charge remaining in the capacitor 1501 and the charge remaining in the capacitor 1521 along with the capacitor 1521 and capacitor 1541. When the sampling switch 131 is turned ON, the charging switches 1710 and 1740 are turned ON, the capacitor 1501 shares the charge input from the voltage current conversion section 120, the charge remaining in the capacitor 1501 and the charge remaining in the capacitor 1510 along with the capacitor 1510 and the capacitor 1540. When the sampling switch 131 is turned ON, and the charging switches 1711 and 1741 are turned ON, the capacitor 1501 shares the charge input from the voltage current conversion section 120, the charge remaining in the capacitor 1501, and the charge remaining in the capacitor 1511 along with the capacitor 1511 and the capacitor 1541.

A description is given of the capacitors 1510 and 1511 which serve as the first integration unit. When the sampling switch 130 is turned ON, and the charging switches 1610 and 1630 are turned ON, the capacitor 1510 shares the charge input from the voltage current conversion section 120, the charge remaining in the capacitor 1500, and the charge remaining in the capacitor 1510 along with the capacitor 1500 and the capacitor 1530. When the sampling switch 131 is turned ON, and the charging switches 1710 and 1740 are turned ON, the capacitor 1501 shares the charge input from the voltage current section 120, the charge remaining in the capacitor 1501, and the charge remaining in the capacitor 1510 along with the capacitor 1501 and the capacitor 1540.

When the sampling switch 130 is turned ON, and the charging switches 1611 and 1631 are turned ON, the capacitor 1511 shares the charge input from the voltage current conversion section 120, the charge remaining in the capacitor 1500 and the charge remaining in the capacitor 1511 along with the capacitor 1500 and the capacitor 1531. When the sampling switch 131 is turned ON, and the charging switches 1711 and 1741 are turned ON, the capacitor 1511 shares the charge input from the voltage current conversion section 120, the charge remaining in the capacitor 1501 and the charge remaining in the capacitor 1511 along with the capacitor 1501 and the capacitor 1541.

A description is given of capacitors 1520 and 1521 which serve as the second integration unit. When the sampling switch 131 is turned ON and the charging switches 1720 and 1740 are turned ON, the capacitor 1520 shares the charge input from the voltage current conversion section 120, the charge remaining in the capacitor 1501 and the charge remaining in the capacitor 1520 along with the capacitor 1501 and the capacitor 1540. When the sampling switch 130 is turned ON and the charging switches 1620 and 1630 are turned ON, the capacitor 1520 shares the charge input from the voltage current conversion section 120, the charge remaining in the capacitor 1500, and the charge remaining in the capacitor 1520 along with the capacitor 1500 and the capacitor 1530.

When the sampling switch 131 is turned ON, and the charging switches 1721 and 1741 are turned ON, the capacitor 1521 shares the charge input from the voltage current conversion section 120, the charge remaining in the capacitor 1501 and the charge remaining in the capacitor 1521 along with the capacitor 1501 and the capacitor 1541. When the sampling switch 130 is turned ON and the charging switches 1621 and 1631 are turned ON, the capacitor 1520 shares the charge input from the voltage current conversion section 120, the charge remaining in the capacitor 1500, and the charge remaining in the capacitor 1500 along with the capacitor 1500 and the capacitor 1531.

A description is given of capacitors 1530 and 1531 which serve as the first integration/discharge unit. When the sampling switch 130 is turned ON, and the charging switches 1610 and 1630 are turned ON, the capacitor 1530 shares the charge input from the voltage current conversion section 120, the charge remaining in the capacitor 1500 and the charge remaining in the capacitor 1510 along with the capacitor 1500 and the capacitor 1510. When the sampling switch 130 is turned ON and the charging switches 1720 and 1630 are turned ON, the capacitor 1530 shares the charge input from the voltage current conversion section 120, the charge remaining in the capacitor 1500, and the charge remaining in the capacitor 1520 along with the capacitor 1500 and the capacitor 1520. Also, the discharge switch 1830 is turned ON, and the charge charged in the capacitor 1531 is output.

When the sampling switch 130 is turned ON, and the charging switches 1611 and 1631 are turned ON, the capacitor 1531 shares the charge input from the voltage current conversion section 120, the charge remaining in the capacitor 1500 and the charge remaining in the capacitor 1511 along with the capacitor 1500 and the capacitor 1511. When the sampling switch 130 is turned ON and the charging switches 1721 and 1631 are turned ON, the capacitor 1531 shares the charge input from the voltage current conversion section 120, the charge remaining in the capacitor 1500, and the charge remaining in the capacitor 1521 along with the capacitor 1500 and the capacitor 1521. Also, the discharge switch 1831 is turned ON, and the charge charged in the capacitor 1531 is output.

A description is given of the capacitors 1540 and 1541 which serve as the second integration/discharge unit. When the sampling switch 131 is turned ON, and the charging switches 1720 and 1740 are turned ON, the capacitor 1540 shares the charge input from the voltage current conversion section 120, the charge remaining in the capacitor 1501 and the charge remaining in the capacitor 1520 along with the capacitor 1501 and the capacitor 1520. When the sampling switch 131 is turned ON and the charging switches 1710 and 1740 are turned ON, the capacitor 1540 shares the charge input from the voltage current conversion section 120, the charge remaining in the capacitor 1501, and the charge remaining in the capacitor 1510 along with the capacitor 1501 and the capacitor 1510. Also, the discharge switch 1840 is turned ON, and the charge charged in the capacitor 1540 is output.

When the sampling switch 131 is turned ON, and the charging switches 1721 and 1741 are turned ON, the capacitor 1541 shares the charge input from the voltage current conversion section 120, the charge remaining in the capacitor 1501 and the charge remaining in the capacitor 1521 along with the capacitor 1501 and the capacitor 1521. When the sampling switch 131 is turned ON and the charging switches 1711 and 1741 are turned ON, the capacitor 1541 shares the charge input from the voltage current conversion section 120, the charge remaining in the capacitor 1501, and the charge remaining in the capacitor 1511 along with the capacitor 1501 and the capacitor 1511. Also, the discharge switch 1841 is turned ON, and the charge charged in the capacitor 1541 is output.

Figure 2:
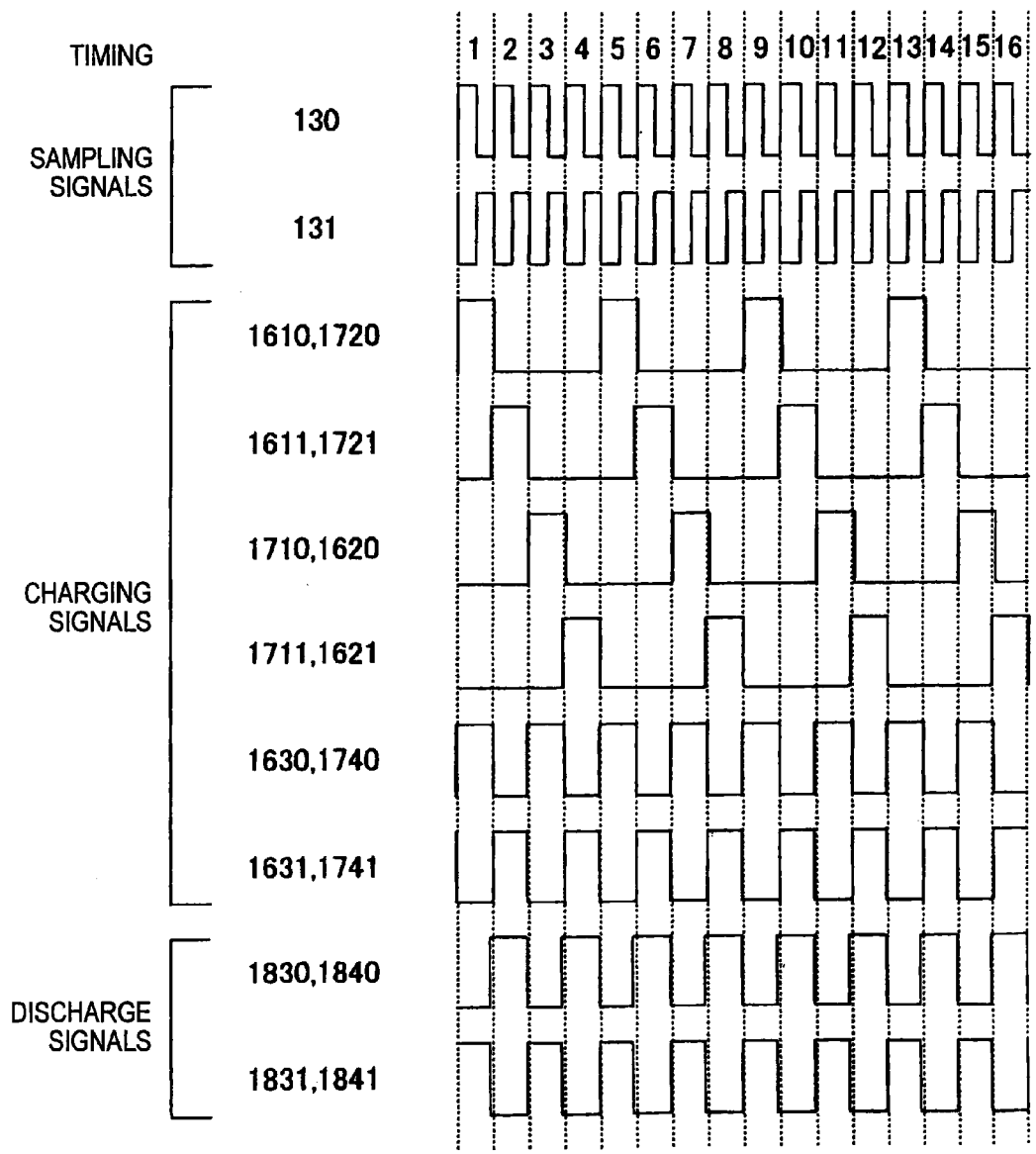
FIG. 2 is a view showing a control signal of a control section in Embodiment 1 according to the present invention.

Next, a description is given of charge sharing and differential composition between capacitors using FIG. 2. FIG. 2 shows control signals in regard to respective switches, and expresses ON and OFF timings of the respective switches. Where the operation frequency of the sampling switches 130 and 131 is 1/T[Hz], timing 1 shows a period of 0 through T[s], timing 2 shows a period of T through 2T[s], and timing L shows a period of (L−1)×T through L×T[s].

The phase of a control signal of the sampling switch 130 is deviated by 180 degrees from that of the sampling switch 131, wherein when the charge charged through the sampling switch 130 is assumed to be positive, the charge charged through the sampling switch 131 becomes negative.

At timing 1, the charging switches 1610, 1720, 1630 and 1740 are turned ON, wherein the sampling switch 130 is turned ON, the voltage current conversion section 120, the capacitor 1500, the capacitor 1510, and the capacitor 1530 are connected to each other, and the charge ($Q_{120}{}^1$) input from the voltage current conversion section 120, the charge ($Q_{1500}{}^0$) charged in the capacitor 1500, and the charge ($-Q_{1510}{}^{-1}$) charged in the capacitor 1510 are shared by the capacitor 1500, the capacitor 1510, and the capacitor 1530, wherein $Q_{1500}{}^1$ is charged in the capacitor 1500, $Q_{1510}{}^1$ is charged in the capacitor 1510, and $Q_{1530}{}^1$ is charged in the capacitor 1530. When the sampling switch 131 is turned ON, the voltage current conversion section 120, the capacitor 1501, the capacitor 1520 and the capacitor 1540 are connected to each other, and the charge ($-Q_{120}{}^1$) input from the voltage current conversion portion 120, the charge ($-Q_{1501}{}^0$) charged in the capacitor 1501, and the charge ($Q_{1520}{}^{-1}$) charged in the capacitor 1520 are shared by the capacitor 1501, the capacitor 1520 and the capacitor 1540, wherein $-Q_{1501}{}^1$ is charged in the capacitor 1501, $-Q_{1520}{}^1$ is charged in the capacitor 1520, and $-Q_{1540}{}^1$ is charged in the capacitor 1540. Also, the discharge switches 1831, 1841 are turned ON, and the charge $Q_{1531}{}^0$ charged in the capacitor 1531 and the charge $-Q_{1541}{}^0$ charged in the capacitor 1541 are output.

At timing 2, the charging switches 1611, 1721, 1631 and 1741 are turned ON. When the sampling switch 130 is turned ON, the voltage current conversion section 120, the capacitor 1500, the capacitor 1511 and the capacitor 1531 are connected to each other, and the charge ($Q_{120}{}^2$) input from the voltage current conversion section 120, the charge ($Q_{1500}{}^1$) charged in the capacitor 1500 and the charge ($Q-_{1511}{}^0$) charged in the capacitor 1511 are shared by the capacitor 1500, the capacitor 1511, and the capacitor 1531, wherein $Q_{1500}{}^2$ is charged in the capacitor 1500, $Q_{1511}{}^2$ is charged in the capacitor 1511, and $Q_{1531}{}^2$ is charged in the capacitor 1531. When the sampling switch 131 is turned ON, the voltage current conversion section 120, the capacitor 1501, the capacitor 1521 and the capacitor 1541 are connected to each other, and the charge ($-Q_{120}{}^2$) input from the voltage current conversion section 120, the charge ($-Q_{1501}{}^1$) charged in the capacitor 1501 and the charge) ($Q_{1521}{}^0$) charged in the capacitor 1521 are shared by the capacitor 1501, the capacitor 1521, and the capacitor 1541, wherein $-Q_{1501}{}^2$ is charged in the capacitor 1501, $-Q_{1521}{}^2$ is charged in the capacitor 1521, and $-Q_{1541}{}^2$ is charged in the capacitor 1541. Also, the discharge switches 1830 and 1840 are turned ON, wherein the charge $Q_{1530}{}^1$ charged in the capacitor 1530 and the charge $-Q_{1540}{}^1$ charged in the capacitor 1540 are output.

At timing 3, the charging switches 1710, 1620, 1630 and 1740 are turned ON. When the sampling switch 130 is turned ON, the voltage current conversion section 120, the capacitor 1500, the capacitor 1520 and the capacitor 1530 are connected to each other, and the charge ($Q_{120}{}^3$) input from the voltage current conversion section 120, the charge ($Q_{1500}{}^2$) charged in the capacitor 1500 and the charge ($-Q_{1520}{}^1$) charged in the capacitor 1520 are shared by the capacitor 1500, the capacitor 1520, and the capacitor 1530, wherein $Q_{1500}{}^3$ is charged in the capacitor 1500, $Q_{1520}{}^3$ is charged in the capacitor 1520, and $Q_{1530}{}^3$ is charged in the capacitor 1530. When the sampling switch 131 is turned ON, the voltage current conversion section 120, the capacitor 1501, the capacitor 1510 and the capacitor 1540 are connected to each other, and the charge ($-Q_{120}{}^3$) input from the voltage current conversion section 120, the charge ($-Q_{1501}{}^2$) charged in the capacitor 1501 and the charge ($Q_{1510}{}^1$) charged in the capacitor 1510 are shared by the capacitor 1501, the capacitor 1510, and the capacitor 1540, wherein $-Q_{1501}{}^3$ is charged in the capacitor 1501, $-Q_{1510}{}^3$ is charged in the capacitor 1510, and $-Q_{1540}{}^3$ is charged in the capacitor 1540. Also, the discharge switches 1831 and 1841 are turned ON, wherein the charge $Q_{1531}{}^2$ charged in the capacitor 1531 and the charge $-Q_{1541}{}^2$ charged in the capacitor 1541 are output.

At timing 4, the charging switches 1711, 1621, 1631 and 1741 are turned ON. When the sampling switch 130 is turned ON, the voltage current conversion section 120, the capacitor 1500, the capacitor 1521 and the capacitor 1531 are connected to each other, and the charge ($Q_{120}{}^4$) input from the voltage current conversion section 120, the charge ($Q_{1500}{}^3$) charged in the capacitor 1500 and the charge ($-Q_{1521}{}^2$) charged in the capacitor 1521 are shared by the capacitor 1500, the capacitor 1521, and the capacitor 1531, wherein $Q_{1500}{}^4$ is charged in the capacitor 1500, $Q_{1521}{}^4$ is charged in the capacitor 1521, and $Q_{1531}{}^4$ is charged in the capacitor 1531. When the sampling switch 131 is turned ON, the voltage current conversion section 120, the capacitor 1501, the capacitor 1511 and the capacitor 1541 are connected to each other, and the charge ($-Q_{120}{}^4$) input from the voltage current conversion section 120, the charge ($-Q_{1501}{}^3$) charged in the capacitor 1501 and the charge ($Q_{1511}{}^2$) charged in the capacitor 1511 are shared by the capacitor 1501, the capacitor 1511, and the capacitor 1541, wherein $-Q_{1501}{}^4$ is charged in the capacitor 1501, $-Q_{1511}{}^4$ is charged in the capacitor 1511, and $-Q_{1541}{}^4$ is charged in the capacitor 1541. Also, the discharge switches 1830 and 1840 are turned ON, wherein the charge $Q_{1530}{}^3$ charged in the capacitor 1530 and the charge $-Q_{1540}{}^3$ charged in the capacitor 1540 are output.

After timing 5, the timings 1 through 4 are repeated. In respective timings, the charges shared by a plurality of capacitors are changed, and at the same time, the charges charged in capacitors other than the plurality of capacitors are output. Where it is assumed that the capacitance of the capacitors 1500 and 1501 is $C_1$, the capacitance of the capacitors 1510, 1511, 1520 and 1521 is $C_2$, and the capacitance of the capacitors 1530, 1531, 1540 and 1541 is $C_3$, the transmission function of the sampling filter apparatus 100 may be expressed by (Expression 1).

[Mathematical Expression 1]    (Expression 1)

$$\frac{y}{x} = \frac{\frac{C_3}{C_1 + C_2 + C_3}}{1 - \frac{C_1}{C_1 + C_2 + C_3}Z^{-1} + \frac{C_2}{C_1 + C_2 + C_3}Z^{-2}}$$

Figure 3:
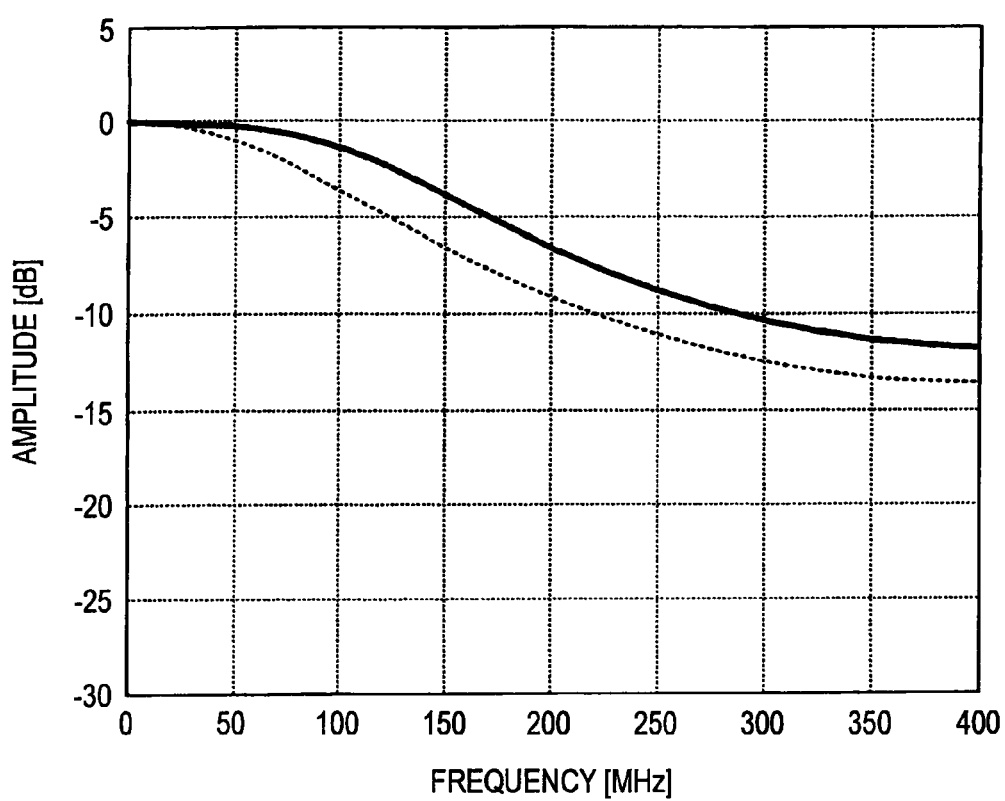
FIG. 3 is a view showing frequency characteristics in a sampling filter apparatus in Embodiment 1 according to the present invention.

The solid line in FIG. 3 shows the filtering characteristics where 1/T is 800 [MHz], $C_1$ is 0.7, $C_2$ is 0.2 and $C_3$ is 0.1. In addition, the dotted line thereof shows the filtering characteristics where $C_1$ is 0.75, $C_2$ is 0.15 and $C_3$ is 0.1. Thus, it is possible to vary the filtering characteristics by changing the values of $C_1$, $C_2$ and $C_3$.

By adopting such a configuration in which the amount of charge charged in capacitors is changed by varying the internal voltage of the voltage current conversion section where the dynamic range of the voltage current conversion section is wide, the filtering characteristics can also be varied.

According to the configuration of the present invention, a negative coefficient may be used as a transmission function of the filter, and simultaneously, a high-order transmission function can be brought about, wherein a sampling filter apparatus having a wide control range of filtering characteristics can be proposed with a comparatively small-sized circuit configuration.

In addition, in the sampling filter apparatus 100, a transmission function that can be expressed by (Expression 2) can be achieved by varying the control signal with respect to respective switches.

[Mathematical Expression 2] (Expression 2)

$$\frac{y}{x} = \frac{\frac{C_3}{C_1+C_2+C_3}}{1 - \frac{C_1}{C_1+C_2+C_3}Z^{-1} + \frac{C_2}{C_1+C_2+C_3}Z^{-2}}$$

Figure 4:
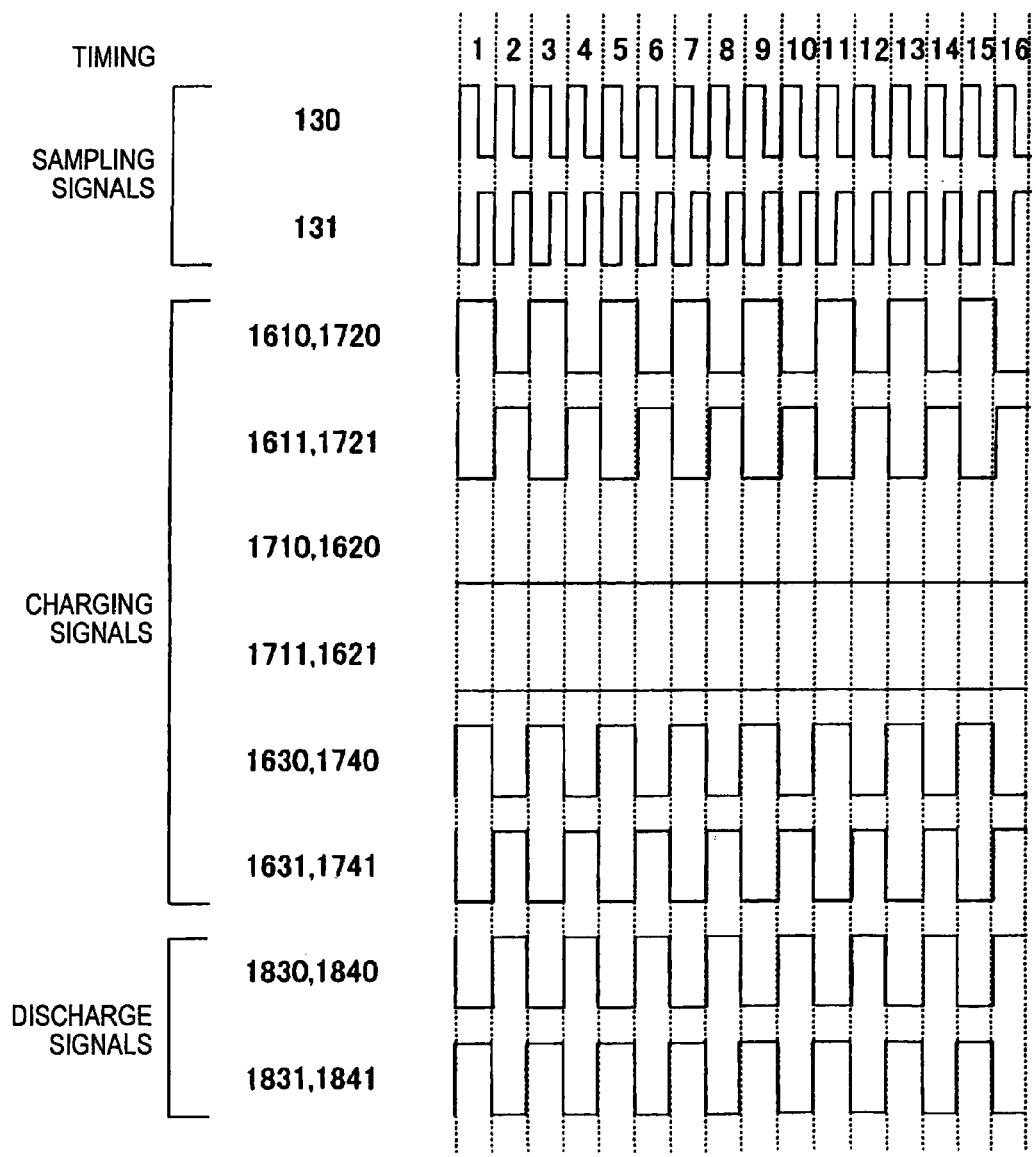
FIG. 4 is a view showing a control signal of a control section in Embodiment 1 according to the present invention.

FIG. 4 shows control signals in regard to respective switches that achieve the transmission function expressed by (Expression 2).

At timing 1, when the charging switches 1610, 1720, 1630 and 1740 are turned ON, and the sampling switch 130 is turned ON, the voltage current conversion section 120, the capacitor 1500, the capacitor 1510, and the capacitor 1530 are connected to each other, and the charge ($Q_{120}^1$) input from the voltage current conversion section 120, the charge)($Q_{1500}^0$) charged in the capacitor 1500, and the charge ($Q_{1510}^{-1}$) charged in the capacitor 1510 are shared by the capacitor 1500, the capacitor 1510 and the capacitor 1530, wherein $Q_{1500}^1$ is charged in the capacitor 1500, $Q_{1510}^1$ is charged in the capacitor 1510, and $Q_{1530}^1$ is charged in the capacitor 1530. When the sampling switch 131 is turned ON, the voltage current conversion section 120, the capacitor 1501, the capacitor 1520, and the capacitor 1540 are connected to each other, and the charge ($-Q_{120}^1$) input from the voltage current conversion section 120, the charge)($-Q_{1501}^0$) charged in the capacitor 1501, and the charge ($-Q_{1520}^{-1}$) charged in the capacitor 1520 are shared by the capacitor 1501, the capacitor 1520 and the capacitor 1540, wherein $-Q_{1501}^1$ is charged in the capacitor 1501, $-Q_{1520}^1$ is charged in the capacitor 1520, and $-Q_{1540}^1$ is charged in the capacitor 1540. Also, the discharge switches 1831 and 1841 are turned ON, and the charge $Q_{1531}^0$ charged in the capacitor 1531 and the charge $-Q_{1541}^0$ charged in the capacitor 1541 are output.

At timing 2, when the charging switches 1611, 1721, 1631 and 1741 are turned ON, and the sampling switch 130 is turned ON, the voltage current conversion section 120, the capacitor 1500, the capacitor 1511, and the capacitor 1531 are connected to each other, and the charge ($Q_{120}^2$) input from the voltage current conversion section 120, the charge ($Q_{1500}^1$) charged in the capacitor 1500, and the charge ($Q_{1511}^0$) charged in the capacitor 1511 are shared by the capacitor 1500, the capacitor 1511 and the capacitor 1531, wherein $Q_{1500}^2$ is charged in the capacitor 1500, $Q1511^2$ is charged in the capacitor 1511, and $Q_{15312}$ is charged in the capacitor 1531. When the sampling switch 131 is turned ON, the voltage current conversion section 120, the capacitor 1501, the capacitor 1521, and the capacitor 1541 are connected to each other, and the charge ($-Q_{120}^2$) input from the voltage current conversion section 120, the charge ($-Q_{1501}^1$) charged in the capacitor 1501, and the charge ($-Q_{1521}^0$) charged in the capacitor 1521 are shared by the capacitor 1501, the capacitor 1521 and the capacitor 1541, wherein $-Q_{1501}^2$ is charged in the capacitor 1501, $-Q_{1521}^2$ is charged in the capacitor 1521, and $-Q_{1541}^2$ is charged in the capacitor 1541. Also, the discharge switches 1830 and 1840 are turned ON, and the charge $Q_{1530}^1$ charged in the capacitor 1530 and the charge $-Q_{1540}^1$ charged in the capacitor 1540 are output.

After timing 3, the timings 1 and 2 are repeated. In the respective timings, the charges shared by a plurality of capacitors are charged, and simultaneously, the charges charged in capacitors other than the plurality of capacitors are output, wherein the charging switches 1710, 1711, 1620 and 1621 remain turned off.

Figure 5:
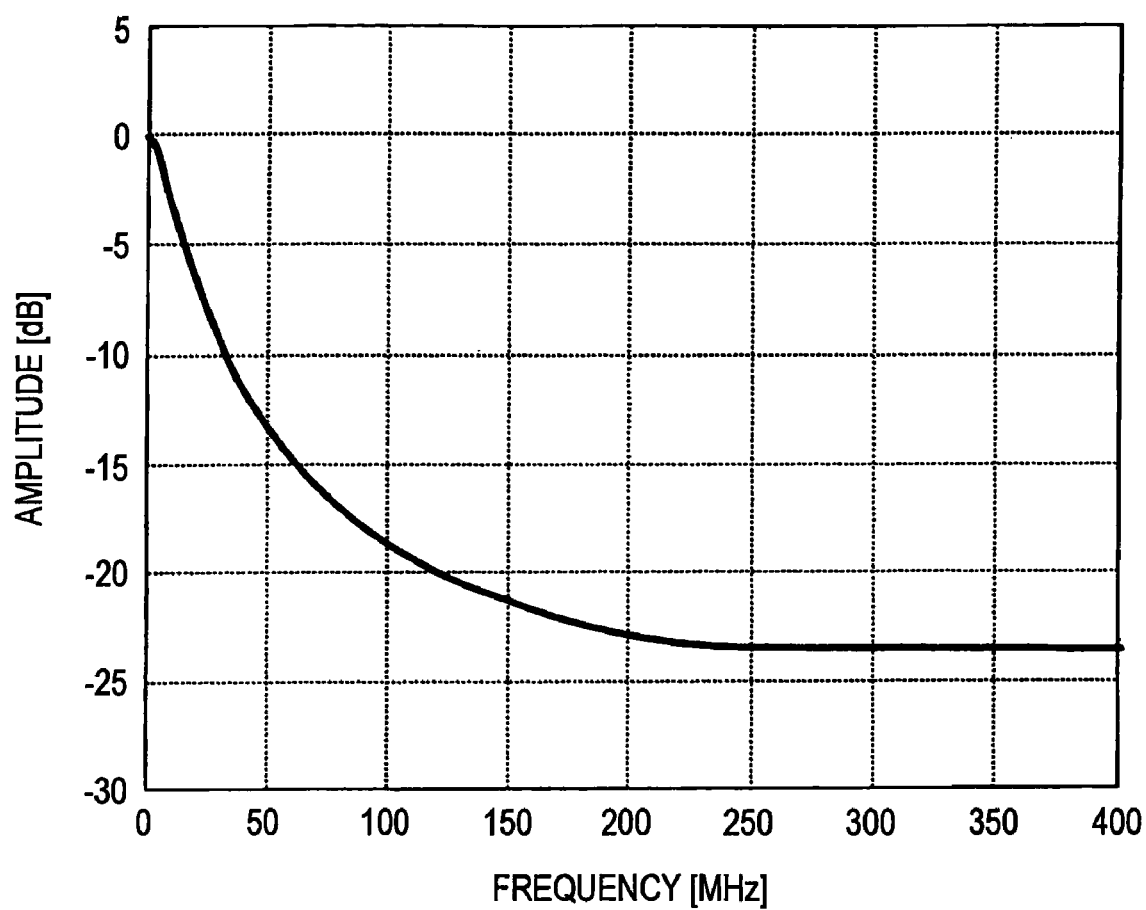
FIG. 5 is a view showing frequency characteristics in a sampling filter apparatus in Embodiment 1 according to the present invention.

The solid line of FIG. 5 shows filtering characteristics where 1/T is 800[MHz], $C_1$ is 0.7, $C_2$ is 0.2, and $C_3$ is 0.1. Thus, it is possible to vary the filtering characteristics by changing the control signals of the respective switches.

Embodiment 2

Figure 6:
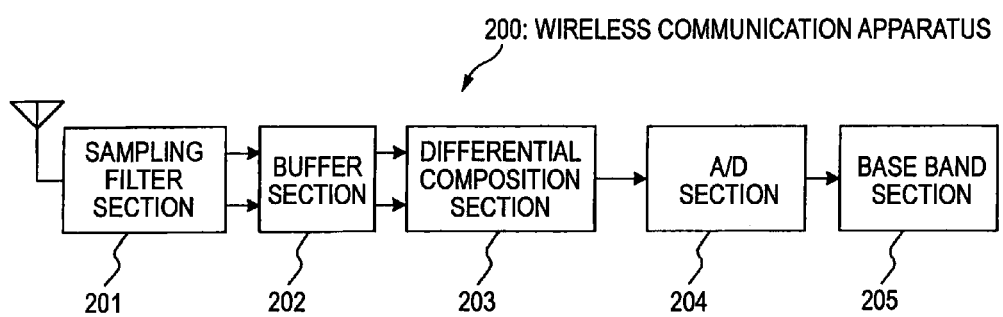
FIG. 6 is a block diagram showing a configuration of a wireless communication apparatus in Embodiment 2 according to the present invention.

FIG. 6 is a block diagram showing a configuration of a wireless communication apparatus according to Embodiment 2 of the present invention. In FIG. 6, a wireless communication apparatus 200 includes a sampling filter section 201, a buffer section 202, a differential composition section 203, an A/D section 204, and a base band section 205.

The sampling filter section 201 is configured to be similar to the sampling filter apparatus 100 according to Embodiment 1 and carries out operations similar thereto, wherein discretizing and filtering processes are carried out with respect to received signals input from an antenna.

The buffer section 202 outputs voltage values of both ends of the capacitors 1530, 1531, 1540 and 1541 of the sampling filter section 201. For example, the buffer section 202 may be configured by an operational amplifier.

The differential composition section 203 outputs a difference between a positive voltage value and a negative voltage value, which are output from the buffer section 202.

The A/D section 204 digitalizes discretized analog signals input from the differential composition section 203.

The base band section 205 carries out a digital signal process with respect to the digital signals input from the A/D section 204.

With such a configuration, a sampling filter apparatus according to Embodiment 1 may be applied to a wireless communication apparatus.

Embodiment 3

Figure 7:
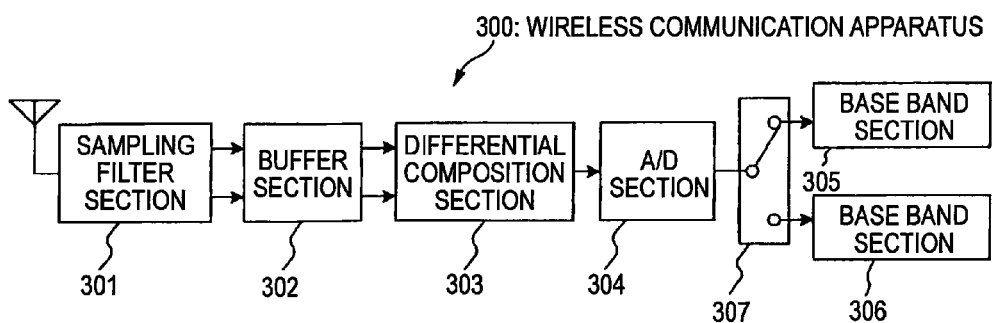
FIG. 7 is a block diagram showing a configuration of a wireless communication apparatus in Embodiment 3 according to the present invention.

FIG. 7 is a block diagram showing a configuration of a wireless communication apparatus according to Embodiment 3 of the present invention. In FIG. 7, a wireless communication apparatus 300 includes a sampling filter section 301, a buffer section 302, a differential composition section 303, an ND section 304, a first base band section 305, a second base band section 306, and a switch 307.

The sampling filter section 301 is configured to be similar to the sampling filter apparatus 100 according to Embodiment 1 and carries out operations similar thereto, wherein discretizing and filtering processes are carried out with respect to received signals input from an antenna, and further it is possible to vary the filtering characteristics by changing control signals of the respective switches.

The buffer section 302 has a function similar to that of the buffer section 202 of FIG. 6, and outputs voltage values of both ends of the capacitors 1530, 1531, 1540 and 1541 of the sampling filter section 301.

The differential composition section 303 has a function similar to that of the differential composition section 203 of FIG. 6, and outputs a difference between a positive voltage value and a negative voltage value, which are output from the buffer section 302.

The A/D section 304 has a function similar to that of the A/D section 204 of FIG. 6 and digitalizes discretized analog signals input from the differential composition section 303.

The first base band section 305 corresponds to the first wireless communication system and carries out a digital signal process with respect to digital signals input from the A/D section 304.

The second base band section 306 corresponds to the second wireless communication system and carries out a digital signal process with respect to digital signals input from the A/D section 304.

With such a configuration, a sampling filter apparatus according to Embodiment 1 can be applied to a wireless communication apparatus corresponding to a plurality of wireless communication systems by varying the filtering characteristics of the sampling filter apparatus.

In addition, it does not matter whether the first wireless communication system or the second wireless communication system is adopted. Also, such a configuration may be accepted which is provided with two A/D sections.

Embodiment 4

Figure 8:
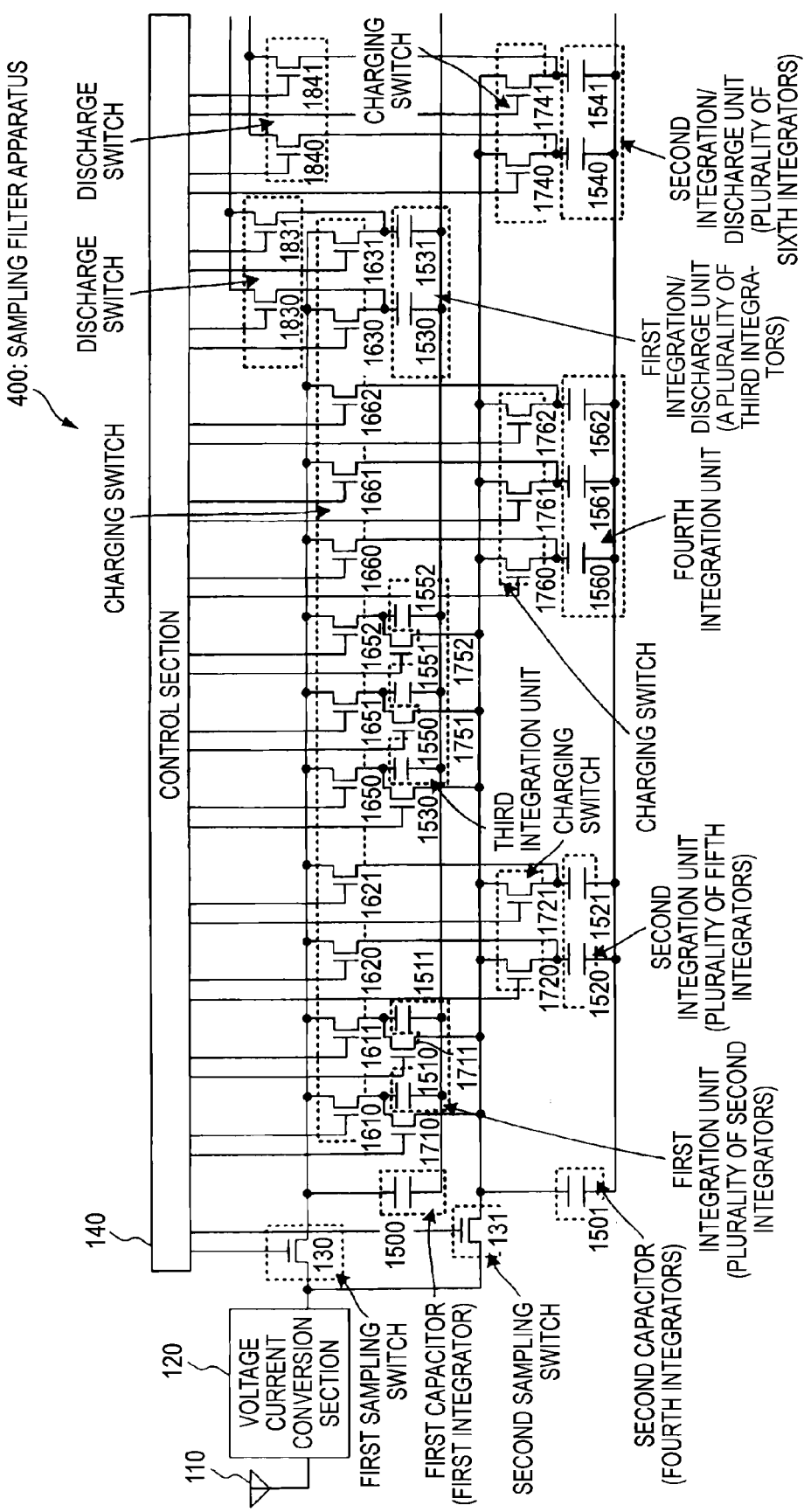
FIG. 8 is a block diagram showing a configuration of a sampling filter apparatus in Embodiment 4 according to the present invention.

FIG. 8 is a block diagram showing a configuration of a sampling filter apparatus according to Embodiment 4 of the present invention. In the present embodiment, a description is given of a case where the sampling filter apparatus has third-order IIR filtering characteristics.

In FIG. 8, a sampling filter apparatus 400 further includes capacitors 1550, 1551, 1552, 1560, 1561 and 1562 and charging switches 1650, 1651, 1652, 1660, 1661, 1662, 1750, 1751, 1752, 1760, 1761 and 1762 in addition to the configuration of the sampling filter apparatus 100 described in Embodiment 1. Description of portions common to those of Embodiment 1 is omitted. Here, the capacitors 1550, 1551 and 1552 serve as the third integration unit, and the capacitors 1560, 1561 and 1562 serve as the fourth integration unit.

Herein, the characteristic point resides in that, in addition to the first integration unit and the second integration unit, the respective capacitors 1550, 1551, 1552, 1560, 1561 and 1562 which serve as the third integration unit and the fourth integration unit are connected to both of the capacitors 1500 and 1501 via charging switches.

Figure 9:
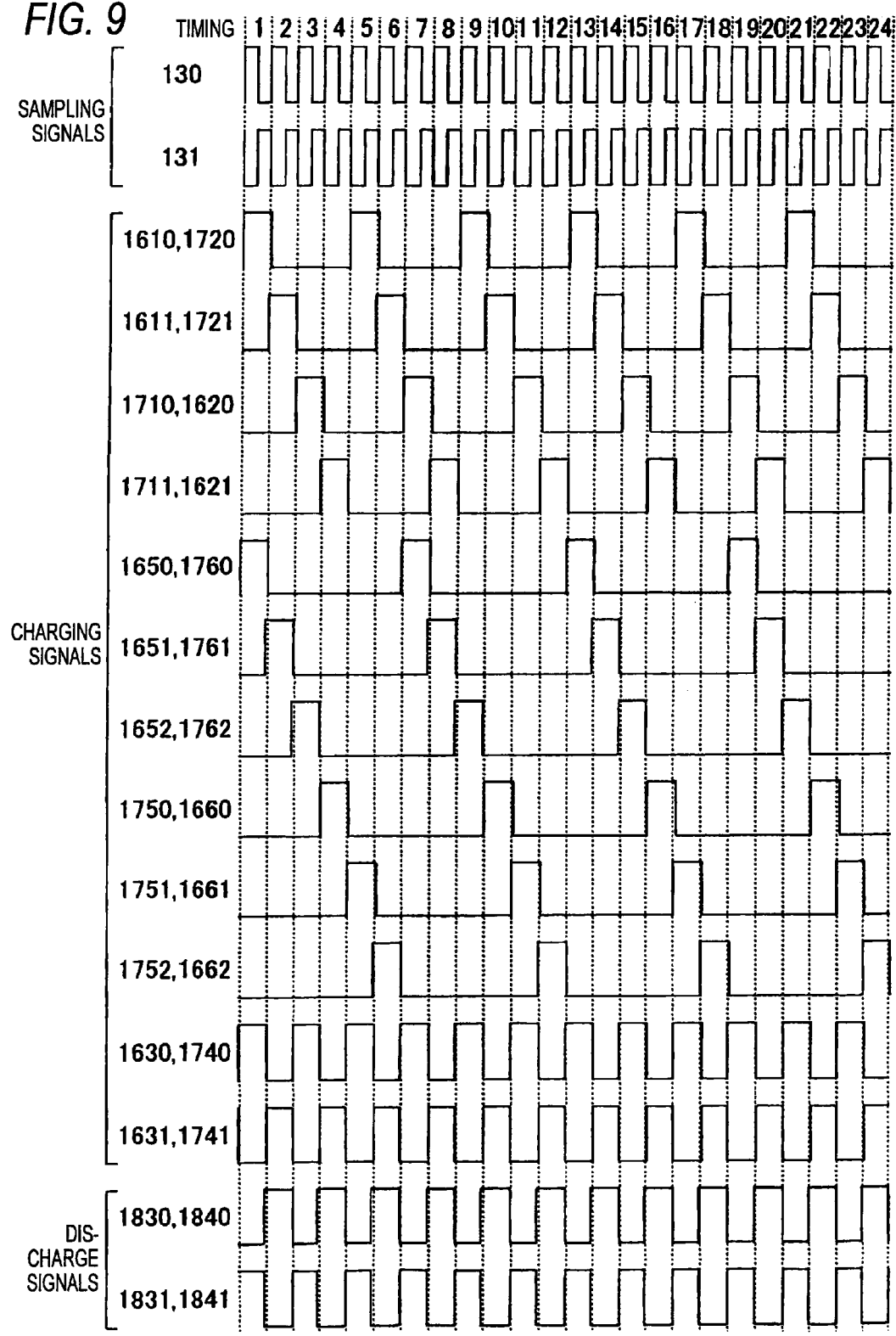
FIG. 9 is a view showing a control signal of a control section in Embodiment 4 according to the present invention.
Figure 10:
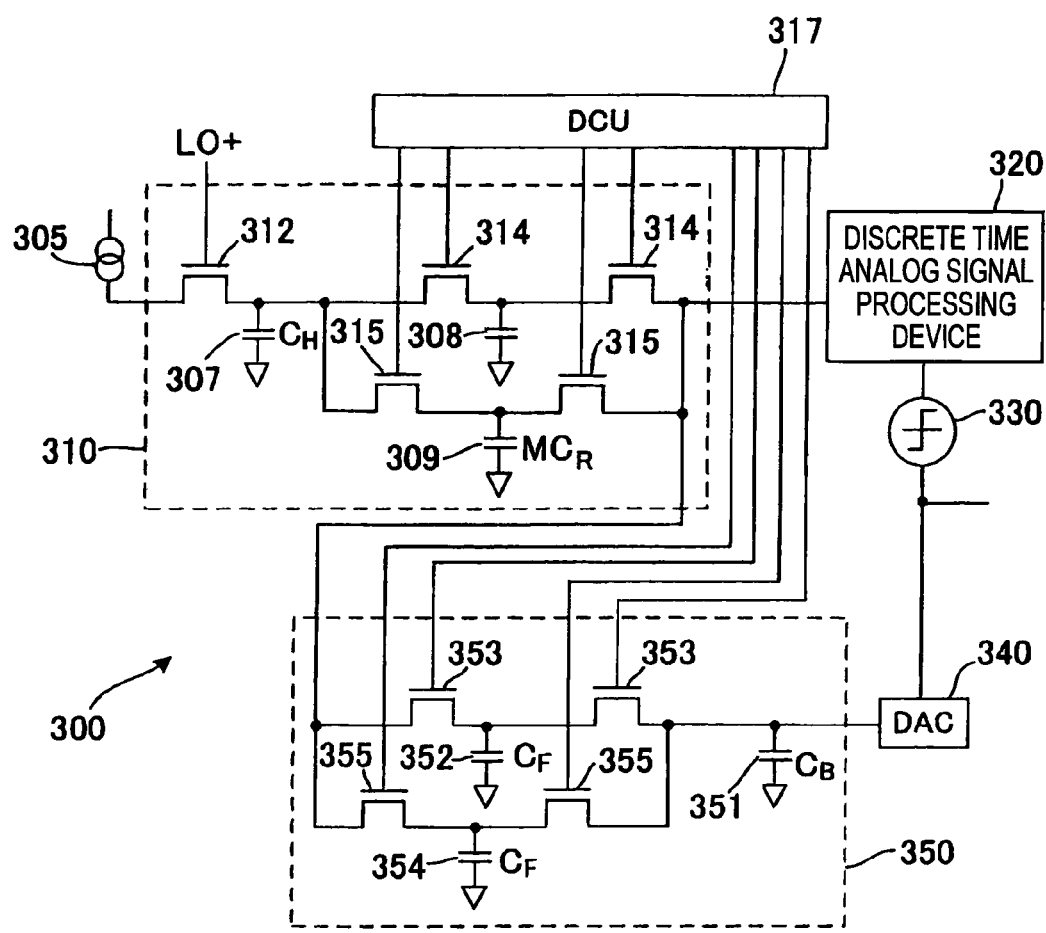
FIG. 10 is a block diagram showing a configuration of a prior art sampling filter apparatus.

FIG. 9 shows control signals with respect to the respective switches. Hereinafter, a description is given of respective timings.

At timing 1, when the charging switches 1610, 1720, 1630, 1740, 1650 and 1760 are turned ON, and the sampling switch 130 is turned ON, the voltage current conversion section 120, the capacitor 1500, the capacitor 1510, the capacitor 1530, and the capacitor 1550 are connected to each other, the charge $(Q_{120}^{1})$ input from the voltage current conversion section 120, the charge) $(Q_{1500}^{0})$ charged in the capacitor 1500, the charge $(-Q_{1510}^{-1})$ charged in the capacitor 1510, and the charge $(-Q_{1550}^{-2})$ charged in the capacitor 1550 are shared by the capacitor 1500, the capacitor 1510, the capacitor 1530 and the capacitor 1550, and $Q_{1500}^{1}$ is charged in the capacitor 1500, $Q_{1510}^{1}$ is charged in the capacitor 1510, $Q_{1530}^{1}$ is charged in the capacitor 1530, and $Q_{1550}^{1}$ is charged in the capacitor 1550. When the sampling switch 131 is turned ON, the voltage current conversion section 120, the capacitor 1501, the capacitor 1520, the capacitor 1540, and the capacitor 1560 are connected to each other, the charge $(-Q_{120}^{1})$ input from the voltage current conversion section 120, the charge $(-Q_{1501}^{0})$ charged in the capacitor 1501, the charge $(Q_{1520}^{-1})$ charged in the capacitor 1520, and the charge $(Q_{1560}^{-2})$ charged in the capacitor 1560 are shared by the capacitor 1501, the capacitor 1520, the capacitor 1540 and the capacitor 1560, and $-Q_{1501}^{1}$ is charged in the capacitor 1501, $-Q_{1520}^{1}$ is charged in the capacitor 1520, $-Q_{1540}^{1}$ is charged in the capacitor 1540, and $-Q_{1560}^{1}$ is charged in the capacitor 1560. Further, the discharge switches 1831 and 1841 are turned ON, wherein the charge $Q_{1531}^{0}$ charged in the capacitor 1531 and the charge $-Q_{1541}^{0}$ charged in the capacitor 1541 are output.

At timing 2, when the charging switches 1611, 1721, 1631, 1741, 1651 and 1761 are turned ON, and the sampling switch 130 is turned ON, the voltage current conversion section 120, the capacitor 1500, the capacitor 1511, the capacitor 1531, and the capacitor 1551 are connected to each other, the charge $(Q_{120}^{2})$ input from the voltage current conversion section 120, the charge $(Q_{1500}^{1})$ charged in the capacitor 1500, the charge) $(-Q_{1511}^{0})$ charged in the capacitor 1511, and the charge $(-Q_{1555}^{-1})$ charged in the capacitor 1551 are shared by the capacitor 1500, the capacitor 1511, the capacitor 1531 and the capacitor 1551, and $Q_{1500}^{2}$ is charged in the capacitor 1500, $Q_{1511}^{2}$ is charged in the capacitor 1511, $Q_{1531}^{2}$ is charged in the capacitor 1531, and $Q_{1551}^{2}$ is charged in the capacitor 1551. When the sampling switch 131 is turned ON, the voltage current conversion section 120, the capacitor 1501, the capacitor 1521, the capacitor 1541, and the capacitor 1561 are connected to each other, the charge $(-Q_{120}^{2})$ input from the voltage current conversion section 120, the charge $(-Q_{1501}^{1})$ charged in the capacitor 1501, the charge $(Q_{1521}^{0})$ charged in the capacitor 1521, and the charge $(Q_{1561}^{-1})$ charged in the capacitor 1561 are shared by the capacitor 1501, the capacitor 1521, the capacitor 1541 and the capacitor 1561, and $-Q_{1501}^{2}$ is charged in the capacitor 1501, $-Q_{1521}^{2}$ is charged in the capacitor 1521, $-Q_{1541}^{2}$ is charged in the capacitor 1541, and $-Q_{1561}^{2}$ is charged in the capacitor 1561. Further, the discharge switches 1830 and 1840 are turned ON, wherein the charge $Q_{1530}^{1}$ charged in the capacitor 1530 and the charge $-Q_{1540}^{1}$ charged in the capacitor 1540 are output.

At timing 3, when the charging switches 1710, 1620, 1630, 1740, 1652 and 1762 are turned ON, and the sampling switch 130 is turned ON, the voltage current conversion section 120, the capacitor 1500, the capacitor 1520, the capacitor 1530, and the capacitor 1552 are connected to each other, the charge $(Q_{120}^{3})$ input from the voltage current conversion section 120, the charge $(Q_{1500}^{2})$ charged in the capacitor 1500, the charge $(-Q_{1520}^{1})$ charged in the capacitor 1520, and the charge $(-Q_{1552}^{0})$ charged in the capacitor 1552 are shared by the capacitor 1500, the capacitor 1520, the capacitor 1530 and the capacitor 1552, and $Q_{1500}^{3}$ is charged in the capacitor 1500, $Q_{1520}^{3}$ is charged in the capacitor 1520, $Q_{1530}^{3}$ is charged in the capacitor 1530, and $Q_{1552}^{3}$ is charged in the capacitor 1552. When the sampling switch 131 is turned ON, the voltage current conversion section 120, the capacitor 1501, the capacitor 1510, the capacitor 1540, and the capacitor 1562 are connected to each other, the charge $(-Q_{120}^{3})$ input from the voltage current conversion section 120, the charge $(-Q_{1501}^{2})$ charged in the capacitor 1501, the charge $(Q_{1510}^{1})$ charged in the capacitor 1510, and the charge $(Q_{1562}^{0})$ charged in the capacitor 1562 are shared by the capacitor 1501, the capacitor 1510, the capacitor 1540 and the capacitor 1562, and $-Q_{1501}^{3}$ is charged in the capacitor 1501, $-Q_{1510}^{3}$ is charged in the capacitor 1510, $-Q_{1540}^{3}$ is charged in the capacitor 1540, and $-Q_{1562}^{3}$ is charged in the capacitor 1562. Further, the discharge switches 1831 and 1841 are turned ON, wherein the charge $Q_{1531}{}^2$ charged in the capacitor 1531 and the charge $-Q_{1541}{}^2$ charged in the capacitor 1541 are output.

At timing 4, when the charging switches 1711, 1621, 1631, 1741, 1750 and 1660 are turned ON, and the sampling switch 130 is turned ON, the voltage current conversion section 120, the capacitor 1500, the capacitor 1521, the capacitor 1531, and the capacitor 1560 are connected to each other, the charge $(Q_{120}{}^4)$ input from the voltage current conversion section 120, the charge $(Q_{1500}{}^3)$ charged in the capacitor 1500, the charge $(-Q_{1521}{}^2)$ charged in the capacitor 1521, and the charge $(-Q_{1560}{}^1)$ charged in the capacitor 1560 are shared by the capacitor 1500, the capacitor 1521, the capacitor 1531 and the capacitor 1560, and $Q_{1500}{}^4$ is charged in the capacitor 1500, $Q_{1521}{}^4$ is charged in the capacitor 1521, $Q_{1531}{}^4$ is charged in the capacitor 1531, and $Q_{1560}{}^4$ is charged in the capacitor 1560. When the sampling switch 131 is turned ON, the voltage current conversion section 120, the capacitor 1501, the capacitor 1511, the capacitor 1541, and the capacitor 1550 are connected to each other, the charge $(-Q_{120}{}^4)$ input from the voltage current conversion section 120, the charge $(-Q_{1501}{}^3)$ charged in the capacitor 1501, the charge $(Q_{1511}{}^2)$ charged in the capacitor 1511, and the charge $(Q_{1550}{}^1)$ charged in the capacitor 1550 are shared by the capacitor 1501, the capacitor 1511, the capacitor 1541 and the capacitor 1550, and $-Q_{1501}{}^4$ is charged in the capacitor 1501, $-Q_{1511}{}^4$ is charged in the capacitor 1511, $-Q_{1541}{}^4$ is charged in the capacitor 1541, and $-Q_{1550}{}^4$ is charged in the capacitor 1550. Further, the discharge switches 1830 and 1840 are turned ON, wherein the charge $Q_{1530}{}^3$ charged in the capacitor 1530 and the charge $-Q_{1540}{}^3$ charged in the capacitor 1540 are output.

At timing 5, when the charging switches 1610, 1720, 1630, 1740, 1751 and 1661 are turned ON, and the sampling switch 130 is turned ON, the voltage current conversion section 120, the capacitor 1500, the capacitor 1510, the capacitor 1530, and the capacitor 1561 are connected to each other, the charge $(Q_{120}{}^5)$ input from the voltage current conversion section 120, the charge $(Q_{1500}{}^4)$ charged in the capacitor 1500, the charge $(-Q_{1510}{}^3)$ charged in the capacitor 1510, and the charge $(-Q_{1561}{}^2)$ charged in the capacitor 1561 are shared by the capacitor 1500, the capacitor 1510, the capacitor 1530 and the capacitor 1561, and $Q_{1500}{}^5$ is charged in the capacitor 1500, $Q1510^5$ is charged in the capacitor 1510, $Q_{1530}{}^5$ is charged in the capacitor 1530, and $Q_{1561}{}^5$ is charged in the capacitor 1561. When the sampling switch 131 is turned ON, the voltage current conversion section 120, the capacitor 1501, the capacitor 1520, the capacitor 1540, and the capacitor 1551 are connected to each other, the charge $(-Q_{120}{}^5)$ input from the voltage current conversion section 120, the charge $(-Q_{1501}{}^4)$ charged in the capacitor 1501, the charge $(Q_{1520}{}^3)$ charged in the capacitor 1520, and the charge $(Q_{1551}{}^2)$ charged in the capacitor 1551 are shared by the capacitor 1501, the capacitor 1520, the capacitor 1540 and the capacitor 1551, and $-Q_{1501}{}^5$ is charged in the capacitor 1501, $-Q_{1520}{}^5$ is charged in the capacitor 1520, $-Q_{1540}{}^5$ is charged in the capacitor 1540, and $-Q_{1551}{}^5$ is charged in the capacitor 1551. Further, the discharge switches 1831 and 1841 are turned ON, wherein the charge $Q_{1531}{}^4$ charged in the capacitor 1531 and the charge $-Q_{1541}{}^4$ charged in the capacitor 1541 are output.

At timing 6, when the charging switches 1611, 1721, 1631, 1741, 1752 and 1662 are turned ON, and the sampling switch 130 is turned ON, the voltage current conversion section 120, the capacitor 1500, the capacitor 1511, the capacitor 1531, and the capacitor 1562 are connected to each other, the charge $(Q_{120}{}^6)$ input from the voltage current conversion section 120, the charge $(Q_{1500}{}^5)$ charged in the capacitor 1500, the charge $(-Q_{1511}{}^4)$ charged in the capacitor 1511, and the charge $(-Q_{1562}{}^3)$ charged in the capacitor 1562 are shared by the capacitor 1500, the capacitor 1511, the capacitor 1531 and the capacitor 1562, and $Q_{1500}{}^6$ is charged in the capacitor 1500, $Q_{1511}{}^6$ is charged in the capacitor 1511, $Q_{1531}{}^6$ is charged in the capacitor 1531, and $Q_{1562}{}^6$ is charged in the capacitor 1562. When the sampling switch 131 is turned ON, the voltage current conversion section 120, the capacitor 1501, the capacitor 1521, the capacitor 1541, and the capacitor 1552 are connected to each other, the charge $(-Q_{120}{}^6)$ input from the voltage current conversion section 120, the charge $(-Q_{1501}{}^5)$ charged in the capacitor 1501, the charge $(Q_{1521}{}^4)$ charged in the capacitor 1521, and the charge $(Q_{1552}{}^3)$ charged in the capacitor 1552 are shared by the capacitor 1501, the capacitor 1521, the capacitor 1541 and the capacitor 1552, and $-Q_{1501}{}^6$ is charged in the capacitor 1501, $-Q_{1521}{}^6$ is charged in the capacitor 1521, $-Q_{1541}{}^6$ is charged in the capacitor 1541, and $-Q_{1552}{}^6$ is charged in the capacitor 1552. Further, the discharge switches 1830 and 1840 are turned ON, wherein the charge $Q_{1530}{}^5$ charged in the capacitor 1530 and the charge $-Q_{1540}{}^5$ charged in the capacitor 1540 are output.

At timing 7, when the charging switches 1710, 1620, 1630, 1740, 1650 and 1760 are turned ON, and the sampling switch 130 is turned ON, the voltage current conversion section 120, the capacitor 1500, the capacitor 1520, the capacitor 1530, and the capacitor 1550 are connected to each other, the charge $(Q_{120}{}^7)$ input from the voltage current conversion section 120, the charge $(Q_{1500}{}^6)$ charged in the capacitor 1500, the charge $(-Q_{1520}{}^5)$ charged in the capacitor 1520, and the charge $(-Q_{1550}{}^4)$ charged in the capacitor 1550 are shared by the capacitor 1500, the capacitor 1520, the capacitor 1530 and the capacitor 1550, and $Q_{1500}{}^7$ is charged in the capacitor 1500, $Q_{1520}{}^7$ is charged in the capacitor 1520, $Q_{1530}{}^7$ is charged in the capacitor 1530, and $Q_{1550}{}^7$ is charged in the capacitor 1550. When the sampling switch 131 is turned ON, the voltage current conversion section 120, the capacitor 1501, the capacitor 1510, the capacitor 1540, and the capacitor 1560 are connected to each other, the charge $(-Q_{120}{}^7)$ input from the voltage current conversion section 120, the charge $(-Q_{1501}{}^6)$ charged in the capacitor 1501, the charge $(Q_{1510}{}^5)$ charged in the capacitor 1510, and the charge $(Q_{1560}{}^4)$ charged in the capacitor 1560 are shared by the capacitor 1501, the capacitor 1510, the capacitor 1540 and the capacitor 1560, and $-Q_{1501}{}^7$ is charged in the capacitor 1501, $-Q_{1510}{}^7$ is charged in the capacitor 1510, $-Q_{1540}{}^7$ is charged in the capacitor 1540, and $-Q_{1560}{}^7$ is charged in the capacitor 1560. Further, the discharge switches 1831 and 1841 are turned ON, wherein the charge $Q_{1531}{}^6$ charged in the capacitor 1531 and the charge $-Q_{1541}{}^6$ charged in the capacitor 1541 are output.

At timing 8, when the charging switches 1711, 1621, 1631, 1741, 1651 and 1761 are turned ON, and the sampling switch 130 is turned ON, the voltage current conversion section 120, the capacitor 1500, the capacitor 1521, the capacitor 1531, and the capacitor 1551 are connected to each other, the charge $(Q_{120}{}^8)$ input from the voltage current conversion section 120, the charge $(Q_{1500}{}^7)$ charged in the capacitor 1500, the charge $(-Q_{1521}{}^6)$ charged in the capacitor 1521, and the charge $(-Q_{1551}{}^5)$ charged in the capacitor 1551 are shared by the capacitor 1500, the capacitor 1521, the capacitor 1531 and the capacitor 1551, and $Q_{1500}{}^8$ is charged in the capacitor 1500, $Q_{1521}{}^8$ is charged in the capacitor 1521, $Q_{1531}{}^8$ is charged in the capacitor 1531, and $Q_{1560}{}^8$ is charged in the capacitor 1551. When the sampling switch 131 is turned ON, the voltage current conversion section 120, the capacitor 1501, the capacitor 1511, the capacitor 1541, and the capacitor 1561 are connected to each other, the charge $(-Q_{120}{}^8)$ input from the voltage current conversion section 120, the charge $(-Q_{1501}{}^7)$ charged in the capacitor 1501, the charge $(Q_{1511}{}^6)$ charged in the capacitor 1511, and the charge $(Q_{1561}{}^5)$ charged in the capacitor 1561 are shared by the capacitor 1501, the capacitor 1511, the capacitor 1541 and the capacitor 1561, and $-Q_{1501}{}^8$ is charged in the capacitor 1501, $-Q_{1511}{}^8$ is charged in the capacitor 1511, $-Q_{1541}{}^8$ is charged in the capacitor 1541, and $-Q_{1561}{}^8$ is charged in the capacitor 1561. Further, the discharge switches 1830 and 1840 are turned ON, wherein the charge $Q_{1530}{}^7$ charged in the capacitor 1530 and the charge $-Q_{1540}{}^7$ charged in the capacitor 1540 are output.

At timing 9, when the charging switches 1610, 1720, 1630, 1740, 1652 and 1762 are turned ON, and the sampling switch 130 is turned ON, the voltage current conversion section 120, the capacitor 1500, the capacitor 1510, the capacitor 1530, and the capacitor 1552 are connected to each other, the charge $(Q_{120}{}^9)$ Input from the voltage current conversion section 120, the charge $(Q_{1500}{}^8)$ charged in the capacitor 1500, the charge $(-Q_{1510}{}^7)$ charged in the capacitor 1510, and the charge $(-Q_{1552}{}^6)$ charged in the capacitor 1552 are shared by the capacitor 1500, the capacitor 1510, the capacitor 1530 and the capacitor 1552, and $Q_{1500}{}^9$ is charged in the capacitor 1500, $Q_{1510}{}^9$ is charged in the capacitor 1510, $Q_{1530}{}^9$ is charged in the capacitor 1530, and $Q_{1552}{}^9$ is charged in the capacitor 1552. When the sampling switch 131 is turned ON, the voltage current conversion section 120, the capacitor 1501, the capacitor 1520, the capacitor 1540, and the capacitor 1562 are connected to each other, the charge $(-Q_{120}{}^9)$ input from the voltage current conversion section 120, the charge $(-Q_{1501}{}^8)$ charged in the capacitor 1501, the charge $(Q_{1520}{}^7)$ charged in the capacitor 1520, and the charge $(Q_{1562}{}^6)$ charged in the capacitor 1562 are shared by the capacitor 1501, the capacitor 1520, the capacitor 1540 and the capacitor 1562, and $-Q_{1501}{}^9$ is charged in the capacitor 1501, $-Q_{1520}{}^9$ is charged in the capacitor 1520, $-Q_{1540}{}^9$ is charged in the capacitor 1540, and $-Q_{1562}{}^9$ is charged in the capacitor 1562. Further, the discharge switches 1831 and 1841 are turned ON, wherein the charge $Q_{1531}{}^8$ charged in the capacitor 1531 and the charge $-Q_{1541}{}^8$ charged in the capacitor 1541 are output.

At timing 10, when the charging switches 1611, 1721, 1631, 1741, 1750 and 1660 are turned ON, and the sampling switch 130 is turned ON, the voltage current conversion section 120, the capacitor 1500, the capacitor 1511, the capacitor 1531, and the capacitor 1560 are connected to each other, the charge $(Q_{120}{}^{10})$ input from the voltage current conversion section 120, the charge $(Q_{1500}{}^9)$ charged in the capacitor 1500, the charge $(-Q_{1511}{}^8)$ charged in the capacitor 1511, and the charge $(-Q_{1560}{}^7)$ charged in the capacitor 1560 are shared by the capacitor 1500, the capacitor 1511, the capacitor 1531 and the capacitor 1560, and $Q_{1500}{}^{10}$ is charged in the capacitor 1500, $Q_{1511}{}^{10}$ is charged in the capacitor 1511, $Q_{1531}{}^{10}$ is charged in the capacitor 1531, and $Q_{1560}{}^{10}$ is charged in the capacitor 1560. When the sampling switch 131 is turned ON, the voltage current conversion section 120, the capacitor 1501, the capacitor 1521, the capacitor 1541, and the capacitor 1550 are connected to each other, the charge $(-Q_{120}{}^{10})$ input from the voltage current conversion section 120, the charge $(-Q_{1501}{}^9)$ charged in the capacitor 1501, the charge $(Q_{1521}{}^8)$ charged in the capacitor 1521, and the charge $(Q_{1550}{}^7)$ charged in the capacitor 1550 are shared by the capacitor 1501, the capacitor 1521, the capacitor 1541 and the capacitor 1550, and $-Q_{1501}{}^{10}$ is charged in the capacitor 1501, $-Q_{1521}{}^{10}$ is charged in the capacitor 1521, $-Q_{1541}{}^{10}$ is charged in the capacitor 1541, and $-Q_{1550}{}^{10}$ is charged in the capacitor 1550. Further, the discharge switches 1830 and 1840 are turned ON, wherein the charge $Q_{1530}{}^9$ charged in the capacitor 1530 and the charge $-Q_{1540}{}^9$ charged in the capacitor 1540 are output.

At timing 11, when the charging switches 1710, 1620, 1630, 1740, 1751 and 1661 are turned ON, and the sampling switch 130 is turned ON, the voltage current conversion section 120, the capacitor 1500, the capacitor 1520, the capacitor 1530, and the capacitor 1561 are connected to each other, the charge $(Q_{120}{}^{11})$ input from the voltage current conversion section 120, the charge $(Q_{1500}{}^{10})$ charged in the capacitor 1500, the charge $(-Q_{1520}{}^9)$ charged in the capacitor 1520, and the charge $(-Q_{1561}{}^8)$ charged in the capacitor 1561 are shared by the capacitor 1500, the capacitor 1520, the capacitor 1530 and the capacitor 1561, and $Q_{1500}{}^{11}$ is charged in the capacitor 1500, $Q_{1520}{}^{11}$ is charged in the capacitor 1520, $Q1530^{11}$ is charged in the capacitor 1530, and $Q1561^{11}$ is charged in the capacitor 1561. When the sampling switch 131 is turned ON, the voltage current conversion section 120, the capacitor 1501, the capacitor 1510, the capacitor 1540, and the capacitor 1551 are connected to each other, the charge $(-Q_{120}{}^{11})$ input from the voltage current conversion section 120, the charge$)(-Q_{1501}{}^{10})$ charged in the capacitor 1501, the charge $(Q_{1510}{}^9)$ charged in the capacitor 1510, and the charge $(Q_{1551}{}^8)$ charged in the capacitor 1551 are shared by the capacitor 1501, the capacitor 1510, the capacitor 1540 and the capacitor 1551, and $-Q_{1501}{}^{11}$ is charged in the capacitor 1501, $-Q_{1510}{}^{11}$ is charged in the capacitor 1510, $-Q_{1540}{}^{11}$ is charged in the capacitor 1540, and $-Q_{1551}{}^{11}$ is charged in the capacitor 1551. Further, the discharge switches 1831 and 1841 are turned ON, wherein the charge $Q_{1531}{}^{10}$ charged in the capacitor 1531 and the charge $-Q1541^{10}$ charged in the capacitor 1541 are output.

At timing 12, when the charging switches 1711, 1621, 1631, 1741, 1752 and 1662 are turned ON, and the sampling switch 130 is turned ON, the voltage current conversion section 120, the capacitor 1500, the capacitor 1521, the capacitor 1531, and the capacitor 1562 are connected to each other, the charge $(Q_{120}{}^{12})$ input from the voltage current conversion section 120, the charge $(Q_{1500}{}^{11})$ charged in the capacitor 1500, the charge $(-Q_{1521}{}^{10})$ charged in the capacitor 1521, and the charge $(-Q_{1562}{}^9)$ charged in the capacitor 1562 are shared by the capacitor 1500, the capacitor 1521, the capacitor 1531 and the capacitor 1562, and $Q_{1500}{}^{12}$ is charged in the capacitor 1500, $Q_{1521}{}^{12}$ is charged in the capacitor 1521, $Q_{1531}{}^{12}$ is charged in the capacitor 1531, and $Q1562^{12}$ is charged in the capacitor 1562. When the sampling switch 131 is turned ON, the voltage current conversion section 120, the capacitor 1501, the capacitor 1511, the capacitor 1541, and the capacitor 1552 are connected to each other, the charge $(-Q_{120}{}^{12})$ input from the voltage current conversion section 120, the charge $(-Q_{1501}{}^{11})$ charged in the capacitor 1501, the charge $(Q_{1511}{}^{10})$ charged in the capacitor 1511, and the charge $(Q_{1552}{}^9)$ charged in the capacitor 1552 are shared by the capacitor 1501, the capacitor 1511, the capacitor 1541 and the capacitor 1552, and $-Q_{1501}{}^{12}$ is charged in the capacitor 1501, $-Q_{1511}{}^{12}$ is charged in the capacitor 1511, $-Q_{1541}{}^{12}$ is charged in the capacitor 1541, and $-Q_{1552}{}^{12}$ is charged in the capacitor 1552. Further, the discharge switches 1830 and 1840 are turned ON, wherein the charge $Q_{1530}{}^{11}$ charged in the capacitor 1530 and the charge $-Q_{1540}{}^{11}$ charged in the capacitor 1540 are output.

After timing 13, timings 1 through 12 are repeated. At the respective timings, the charges shared by a plurality of capacitors are charged, and simultaneously, the charges charged in capacitors other than the plurality of capacitors are output. Where it is assumed that the capacitance of the capacitors 1500 and 1501 is $C_1$, the capacitance of the capacitors 1510, 1511, 1520 and 1521 is $C_2$, the capacitance of the capacitors 1530, 1531, 1540 and 1541 is $C_3$, the capacitance of the capacitors 1550, 1551, 1552, 1560, 1561 and 1562 is $C_4$, the transmission function of the sampling filter apparatus 100 may be expressed by (Expression 3).

[Mathematical Expression 3]

$$\frac{y}{x} = \frac{\frac{C_3}{C_1+C_2+C_3+C_4}}{1 - \frac{C_1}{C_1+C_2+C_3+C_4}Z^{-1} + \frac{C_2}{C_1+C_2+C_3+C_4}Z^{-2} + \frac{C_4}{C_1+C_2+C_3+C_4}Z^{-3}}$$ (Expression 3)

According to the configuration of the present invention, a sampling filter apparatus, which is capable of using a negative coefficient as a transmission function of a filter, simultaneously achieving a high-order transmission function, and has a wide control range of filtering characteristics, can be proposed with a comparatively small circuit scale.

In addition, by changing the control signals corresponding to the respective switches as in Embodiment 1, the sampling filter apparatus 400 can achieve a transmission function in which positive and negative of the coefficient of the terms of $Z^{-2}$ and $Z^{-3}$ of the transmission function expressed in (Expression 3) can be reversed, and the sampling filter apparatus 400 can be used for a wireless communication apparatus similar to Embodiments 2 and 3.

Further, in the present invention, a description was given of a case of having second-order IIR filtering characteristics in Embodiment 1 and third-order filtering characteristics in Embodiment 4. However, where further capacitors and charging switches are provided, it becomes possible to achieve a sampling filter apparatus having still further high-order IIR characteristics.

Embodiment 5

Figure 11:
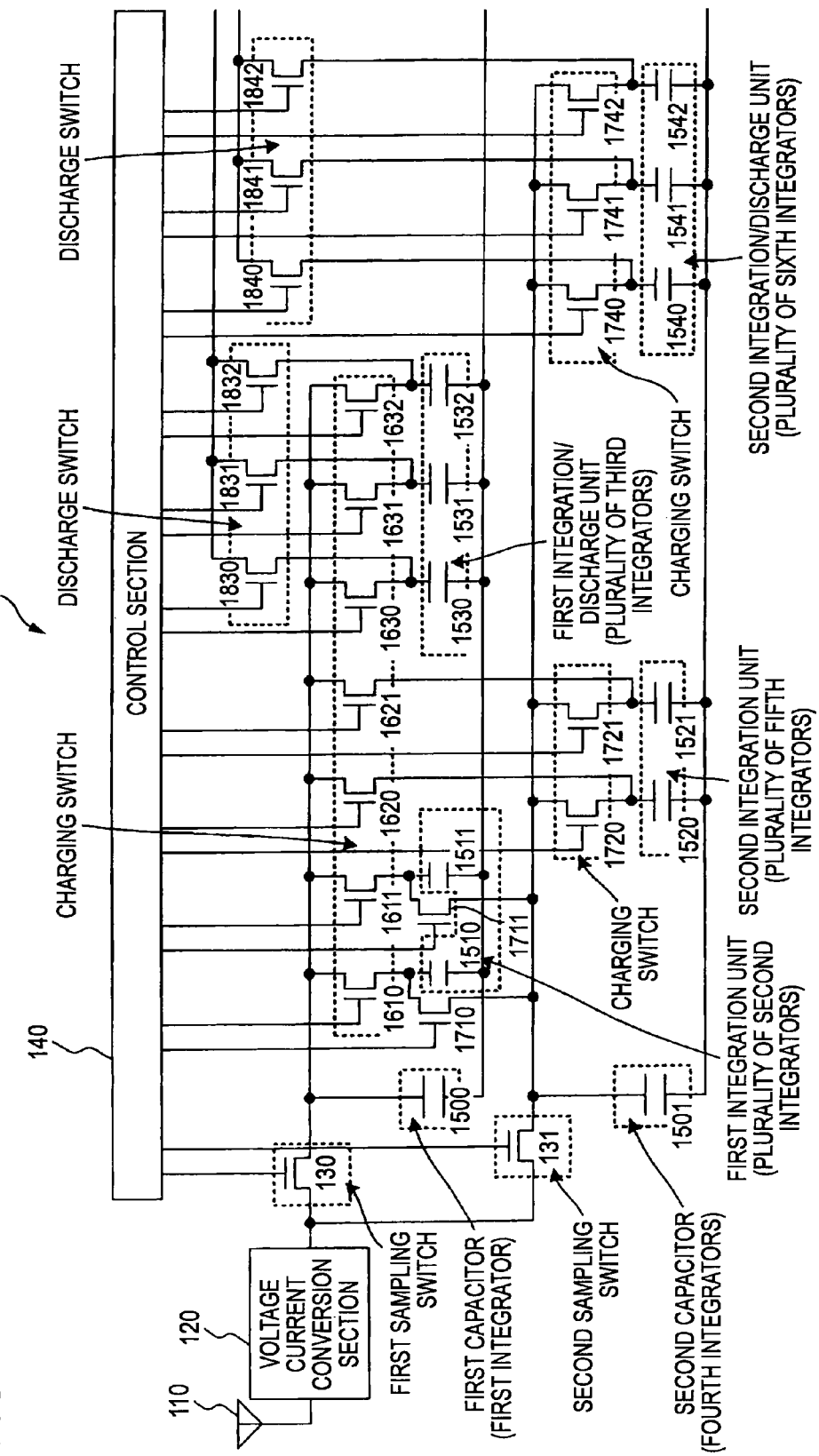
FIG. 11 is a block diagram showing a configuration of a sampling filter apparatus in Embodiment 5 according to the present invention.

FIG. 11 is a block diagram showing a configuration of a sampling filter apparatus according to Embodiment 5 of the present invention. In the present embodiment, a description is given of a case where the sampling filter apparatus is provided with second-order IIR filtering characteristics and second-order FIR filtering characteristics.

In FIG. 11, a sampling filter apparatus 500 further includes capacitors 1532 and 1542, charging switches 1632 and 1742, and discharge switches 1832 and 1842 in addition to the configuration of the sampling filter apparatus 100 described in Embodiment 1. As for portions common to FIG. 1 of Embodiment 1, the description thereof is omitted. Here, the capacitor 1532 serves as the first integration/discharge unit, and the capacitor 1542 serves as the second integration/discharge unit.

Figure 12:
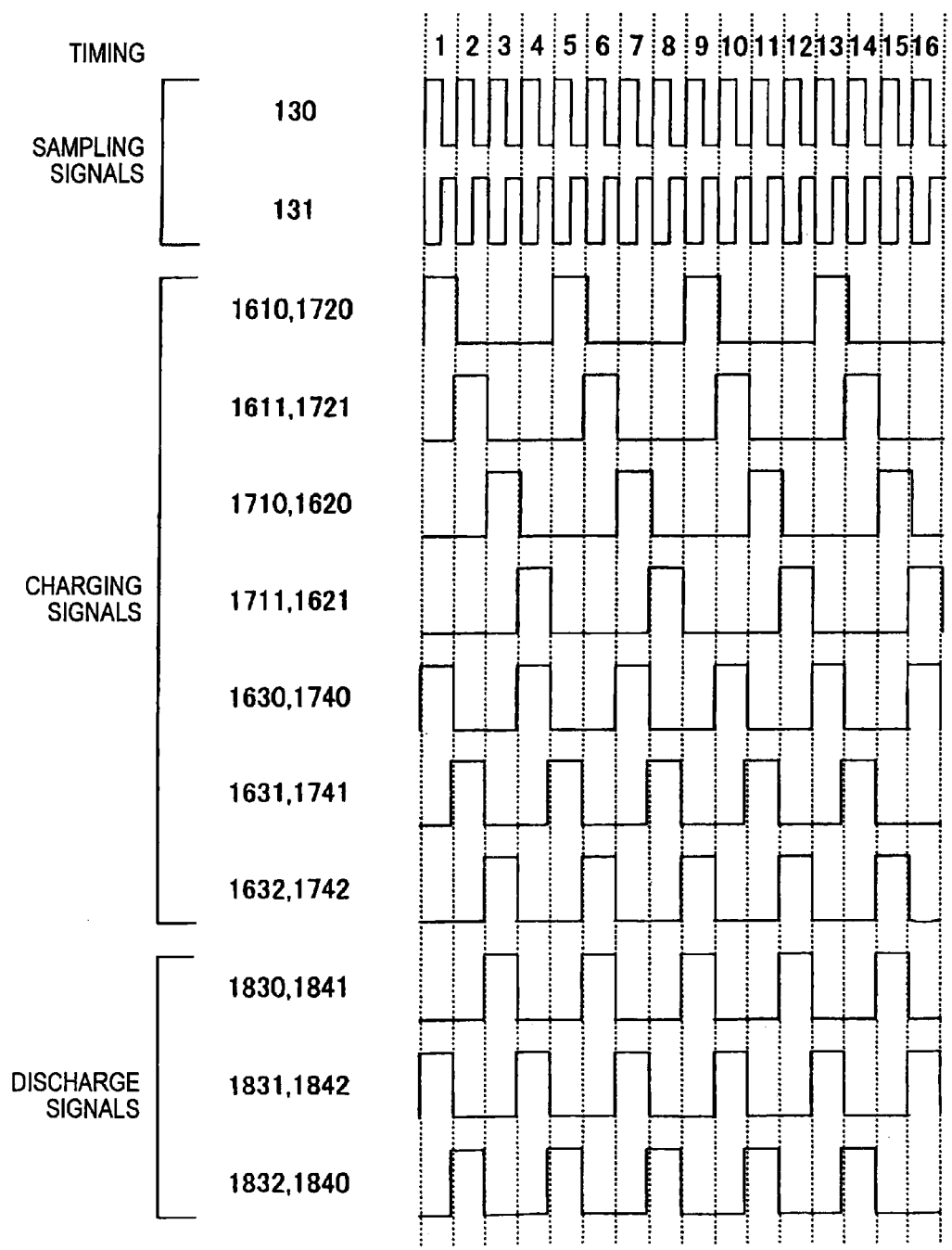
FIG. 12 is a view showing a control signal of a control section in Embodiment 5 according to the present invention.

FIG. 12 shows control signals corresponding to the respective switches. Hereinafter, a description is given of respective timings.

At timing 1, when the charging switches 1610, 1720, 1630 and 1740 are turned ON, and the sampling switch 130 is turned ON, the voltage current conversion section 120, the capacitor 1500, the capacitor 1510, and the capacitor 1530 are connected to each other, the charge $(Q_{120}{}^1)$ input from the voltage current conversion section 120, the charge $(Q_{1500}{}^0)$ charged in the capacitor 1540, and the charge $(-Q_{1510}{}^{-1})$ charged in the capacitor 1510 are shared by the capacitor 1500, the capacitor 1510 and the capacitor 1530, and $Q_{1500}{}^1$ is charged in the capacitor 1500, $Q_{1510}{}^1$ is charged in the capacitor 1510, and $Q_{1530}{}^1$ is charged in the capacitor 1530. When the sampling switch 131 is turned ON, the voltage current conversion section 120, the capacitor 1501, the capacitor 1520 and the capacitor 1540 are connected to each other, the charge $(-Q_{120}{}^1)$ input from the voltage current conversion section 120, the charge $(-Q_{1501}{}^0)$ charged in the capacitor 1501, and the charge $(Q_{1520}{}^{-1})$ charged in the capacitor 1520 are shared by the capacitor 1501, the capacitor 1520, and the capacitor 1540, and $-Q_{1501}{}^1$ is charged in the capacitor 1501, $-Q_{1520}{}^1$ is charged in the capacitor 1520, and $-Q_{1540}{}^1$ is charged in the capacitor 1540. In addition, the discharge switches 1831 and 1842 are turned ON, and the charge $Q1531^{-1}$ charged in the capacitor 1531 and the charge $-Q_{1542}{}^0$ charged in the capacitor 1542 are output.

At timing 2, when the charging switches 1611, 1721, 1631 and 1741 are turned ON, and the sampling switch 130 is turned ON, the voltage current conversion section 120, the capacitor 1500, the capacitor 1511, and the capacitor 1531 are connected to each other, the charge $(Q_{120}{}^2)$ input from the voltage current conversion section 120, the charge $(Q_{1500}{}^1)$ charged in the capacitor 1500, and the charge $(-Q_{1511}{}^0)$ charged in the capacitor 1511 are shared by the capacitor 1500, the capacitor 1511 and the capacitor 1531, and $Q_{1500}{}^2$ is charged in the capacitor 1500, $Q_{1511}{}^2$ is charged in the capacitor 1511, and $Q1531^2$ is charged in the capacitor 1531. When the sampling switch 131 is turned ON, the voltage current conversion section 120, the capacitor 1501, the capacitor 1521 and the capacitor 1541 are connected to each other, the charge $(-Q_{120}{}^2)$ input from the voltage current conversion section 120, the charge $(-Q_{1501}{}^1)$ charged in the capacitor 1501, and the charge $(Q_{1521}{}^0)$ charged in the capacitor 1521 are shared by the capacitor 1501, the capacitor 1521, and the capacitor 1541, and $Q_{1501}{}^2$ is charged in the capacitor 1501, $-Q_{1521}{}^2$ is charged in the capacitor 1521, and $-Q_{1541}{}^2$ is charged in the capacitor 1541. In addition, the discharge switches 1832 and 1840 are turned ON, and the charge $Q_{1532}{}^0$ charged in the capacitor 1532 and the charge $-Q_{1540}{}^1$ charged in the capacitor 1540 are output.

At timing 3, when the charging switches 1710, 1620, 1632 and 1742 are turned ON, and the sampling switch 130 is turned ON, the voltage current conversion section 120, the capacitor 1500, the capacitor 1520, and the capacitor 1532 are connected to each other, the charge $(Q_{120}{}^3)$ input from the voltage current conversion section 120, the charge $(Q_{1500}{}^2)$ charged in the capacitor 1500, and the charge $(-Q_{1520}{}^1)$ charged in the capacitor 1520 are shared by the capacitor 1500, the capacitor 1520 and the capacitor 1532, and $Q_{1500}{}^3$ is charged in the capacitor 1500, $Q_{1520}{}^3$ is charged in the capacitor 1520, and $Q_{1532}{}^3$ is charged in the capacitor 1532. When the sampling switch 131 is turned ON, the voltage current conversion section 120, the capacitor 1501, the capacitor 1510 and the capacitor 1542 are connected to each other, the charge $(-Q_{120}{}^3)$ input from the voltage current conversion section 120, the charge $(-Q_{1501}{}^2)$ charged in the capacitor 1501, and the charge $(Q_{1510}{}^1)$ charged in the capacitor 1521 are shared by the capacitor 1501, the capacitor 1510, and the capacitor 1542, and $-Q_{1501}{}^3$ is charged in the capacitor 1501, $-Q_{1510}{}^3$ is charged in the capacitor 1510, and $-Q_{1542}{}^3$ is charged in the capacitor 1542. In addition, the discharge switches 1830 and 1841 are turned ON, and the charge $Q_{1530}{}^1$ charged in the capacitor 1530 and the charge $Q_{1541}{}^2$ charged in the capacitor 1541 are output.

At timing 4, when the charging switches 1711, 1621, 1630 and 1740 are turned ON, and the sampling switch 130 is turned ON, the voltage current conversion section 120, the capacitor 1500, the capacitor 1521, and the capacitor 1530 are connected to each other, the charge ($Q_{120}^4$) input from the voltage current conversion section 120, the charge ($Q_{1500}^3$) charged in the capacitor 1500, and the charge ($-Q_{1521}^2$) charged in the capacitor 1521 are shared by the capacitor 1500, the capacitor 1521 and the capacitor 1530, and $Q_{1500}^4$ is charged in the capacitor 1500, $Q_{1521}^4$ is charged in the capacitor 1521, and $Q_{1530}^4$ is charged in the capacitor 1530. When the sampling switch 131 is turned ON, the voltage current conversion section 120, the capacitor 1501, the capacitor 1511 and the capacitor 1540 are connected to each other, the charge ($-Q_{120}^4$) input from the voltage current conversion section 120, the charge ($-Q_{1501}^3$) charged in the capacitor 1501, and the charge ($Q_{1511}^2$) charged in the capacitor 1511 are shared by the capacitor 1501, the capacitor 1511, and the capacitor 1540, and $-Q1501^4$ is charged in the capacitor 1501, $-Q_{1511}^4$ is charged in the capacitor 1511, and $-Q_{1540}^4$ is charged in the capacitor 1540. In addition, the discharge switches 1831 and 1842 are turned ON, and the charge $Q_{1531}^2$ charged in the capacitor 1530 and the charge $-Q_{1542}^3$ charged in the capacitor 1542 are output.

At timing 5, when the charging switches 1610, 1720, 1631 and 1741 are turned ON, and the sampling switch 130 is turned ON, the voltage current conversion section 120, the capacitor 1500, the capacitor 1510, and the capacitor 1531 are connected to each other, the charge ($Q_{120}^5$) input from the voltage current conversion section 120, the charge ($Q_{1500}^4$) charged in the capacitor 1500, and the charge ($-Q_{1510}^3$) charged in the capacitor 1510 are shared by the capacitor 1500, the capacitor 1510 and the capacitor 1531, and $Q_{1500}^5$ is charged in the capacitor 1500, $Q_{1510}^5$ is charged in the capacitor 1510, and $Q_{1531}^5$ is charged in the capacitor 1531. When the sampling switch 131 is turned ON, the voltage current conversion section 120, the capacitor 1501, the capacitor 1520 and the capacitor 1541 are connected to each other, the charge ($-Q_{120}^5$) input from the voltage current conversion section 120, the charge ($-Q_{1501}^4$) charged in the capacitor 1501, and the charge ($Q_{1520}^3$) charged in the capacitor 1520 are shared by the capacitor 1501, the capacitor 1520, and the capacitor 1541, and $-Q_{1501}^5$ is charged in the capacitor 1501, $-Q_{1520}^5$ is charged in the capacitor 1520, and $-Q_{1541}^5$ is charged in the capacitor 1541. In addition, the discharge switches 1832 and 1840 are turned ON, and the charge $Q_{1532}^3$ charged in the capacitor 1532 and the charge $-Q_{1540}^4$ charged in the capacitor 1540 are output.

At timing 6, when the charging switches 1611, 1721, 1632 and 1742 are turned ON, and the sampling switch 130 is turned ON, the voltage current conversion section 120, the capacitor 1500, the capacitor 1511, and the capacitor 1532 are connected to each other, the charge ($Q_{120}^6$) input from the voltage current conversion section 120, the charge ($Q_{1500}^5$) charged in the capacitor 1500, and the charge ($-Q_{1511}^4$) charged in the capacitor 1511 are shared by the capacitor 1500, the capacitor 1511 and the capacitor 1532, and $Q_{1500}^6$ is charged in the capacitor 1500, $Q_{1511}^6$ is charged in the capacitor 1511, and $Q_{1532}^6$ is charged in the capacitor 1532. When the sampling switch 131 is turned ON, the voltage current conversion section 120, the capacitor 1501, the capacitor 1521 and the capacitor 1542 are connected to each other, the charge ($-Q_{720}^6$) input from the voltage current conversion section 120, the charge ($-Q_{1501}^5$) charged in the capacitor 1501, and the charge ($Q_{1521}^4$) charged in the capacitor 1521 are shared by the capacitor 1501, the capacitor 1521, and the capacitor 1542, and $-Q_{1501}^6$ is charged in the capacitor 1501, $-Q_{1521}^6$ is charged in the capacitor 1521, and $-Q_{1542}^6$ is charged in the capacitor 1542. In addition, the discharge switches 1830 and 1841 are turned ON, and the charge $Q_{1530}^4$ charged in the capacitor 1530 and the charge $-Q_{1541}^5$ charged in the capacitor 1541 are output.

At timing 7, when the charging switches 1710, 1620, 1630 and 1740 are turned ON, and the sampling switch 130 is turned ON, the voltage current conversion section 120, the capacitor 1500, the capacitor 1520, and the capacitor 1530 are connected to each other, the charge ($Q_{120}^7$) input from the voltage current conversion section 120, the charge ($Q_{1500}^6$) charged in the capacitor 1500, and the charge ($-Q_{1520}^5$) charged in the capacitor 1520 are shared by the capacitor 1500, the capacitor 1520 and the capacitor 1530, and $Q1500^7$ is charged in the capacitor 1500, $Q_{1520}^7$ is charged in the capacitor 1520, and $Q_{1530}^7$ is charged in the capacitor 1530. When the sampling switch 131 is turned ON, the voltage current conversion section 120, the capacitor 1501, the capacitor 1510 and the capacitor 1540 are connected to each other, the charge ($-Q_{120}^7$) input from the voltage current conversion section 120, the charge ($-Q_{1501}^6$) charged in the capacitor 1501, and the charge ($Q_{1510}^5$) charged in the capacitor 1510 are shared by the capacitor 1501, the capacitor 1510, and the capacitor 1540, and $-Q_{1501}^7$ is charged in the capacitor 1501, $-Q_{1510}^7$ is charged in the capacitor 1510, and $-Q_{1540}^7$ is charged in the capacitor 1540. In addition, the discharge switches 1831 and 1842 are turned ON, and the charge $Q_{1531}^5$ charged in the capacitor 1531 and the charge $Q_{1542}^6$ charged in the capacitor 1542 are output.

At timing 8, when the charging switches 1711, 1621, 1631 and 1741 are turned ON, and the sampling switch 130 is turned ON, the voltage current conversion section 120, the capacitor 1500, the capacitor 1521, and the capacitor 1531 are connected to each other, the charge ($Q_{120}^8$) input from the voltage current conversion section 120, the charge ($Q_{1500}^7$) charged in the capacitor 1500, and the charge ($-Q_{1521}^5$) charged in the capacitor 1521 are shared by the capacitor 1500, the capacitor 1521 and the capacitor 1531, and $Q1500^8$ is charged in the capacitor 1500, $Q_{1521}^8$ is charged in the capacitor 1521, and $Q_{1531}^8$ is charged in the capacitor 1531. When the sampling switch 131 is turned ON, the voltage current conversion section 120, the capacitor 1501, the capacitor 1511 and the capacitor 1541 are connected to each other, the charge ($-Q_{120}^8$) input from the voltage current conversion section 120, the charge ($-Q_{1501}^7$) charged in the capacitor 1501, and the charge ($Q_{1511}^6$) charged in the capacitor 1511 are shared by the capacitor 1501, the capacitor 1511, and the capacitor 1541, and $-Q_{1501}^8$ is charged in the capacitor 1501, $-Q_{1511}^8$ is charged in the capacitor 1511, and $-Q_{1541}^8$ is charged in the capacitor 1541. In addition, the discharge switches 1832 and 1840 are turned ON, and the charge $Q_{1532}^6$ charged in the capacitor 1532 and the charge $-Q_{1540}^7$ charged in the capacitor 1540 are output.

At timing 9, when the charging switches 1610, 1720, 1632 and 1742 are turned ON, and the sampling switch 130 is turned ON, the voltage current conversion section 120, the capacitor 1500, the capacitor 1510, and the capacitor 1532 are connected to each other, the charge ($Q_{120}^9$) input from the voltage current conversion section 120, the charge ($Q_{1500}^8$) charged in the capacitor 1500, and the charge ($-Q_{1510}^7$) charged in the capacitor 1510 are shared by the capacitor 1500, the capacitor 1510 and the capacitor 1532, and $Q_{1500}^9$ is charged in the capacitor 1500, $Q_{1510}^9$ is charged in the capacitor 1510, and $Q_{1532}^9$ is charged in the capacitor 1532. When the sampling switch 131 is turned ON, the voltage current conversion section 120, the capacitor 1501, the capacitor 1520 and the capacitor 1542 are connected to each other, the charge ($-Q_{120}{}^9$) input from the voltage current conversion section 120, the charge ($-Q_{1501}{}^8$) charged in the capacitor 1501, and the charge ($Q_{1520}{}^7$) charged in the capacitor 1520 are shared by the capacitor 1501, the capacitor 1520, and the capacitor 1542, and $-Q1501^9$ is charged in the capacitor 1501, $-Q_{1520}{}^9$ is charged in the capacitor 1520, and $-Q_{1542}{}^9$ is charged in the capacitor 1542. In addition, the discharge switches 1830 and 1841 are turned ON, and the charge $Q_{1530}{}^7$ charged in the capacitor 1530 and the charge $-Q_{1541}{}^8$ charged in the capacitor 1541 are output.

At timing 10, when the charging switches 1611, 1721, 1630 and 1740 are turned ON, and the sampling switch 130 is turned ON, the voltage current conversion section 120, the capacitor 1500, the capacitor 1511, and the capacitor 1530 are connected to each other, the charge ($Q_{120}{}^{10}$) input from the voltage current conversion section 120, the charge ($Q_{1500}{}^9$) charged in the capacitor 1500, and the charge ($-Q_{1511}{}^8$) charged in the capacitor 1511 are shared by the capacitor 1500, the capacitor 1511 and the capacitor 1530, and $Q_{1500}{}^{10}$ is charged in the capacitor 1500, $Q_{1511}{}^{10}$ is charged in the capacitor 1511, and $Q_{1530}{}^{10}$ is charged in the capacitor 1530. When the sampling switch 131 is turned ON, the voltage current conversion section 120, the capacitor 1501, the capacitor 1521 and the capacitor 1540 are connected to each other, the charge ($-Q_{120}{}^{10}$) input from the voltage current conversion section 120, the charge ($-Q_{1501}{}^9$) charged in the capacitor 1501, and the charge ($Q_{1521}{}^8$) charged in the capacitor 1521 are shared by the capacitor 1501, the capacitor 1521, and the capacitor 1540, and $-Q_{1501}{}^{10}$ is charged in the capacitor 1501, $-Q_{1521}{}^{10}$ is charged in the capacitor 1521, and $-Q_{1540}{}^{10}$ is charged in the capacitor 1540. In addition, the discharge switches 1831 and 1842 are turned ON, and the charge $Q_{1531}{}^8$ charged in the capacitor 1531 and the charge $-Q_{1542}{}^9$ charged in the capacitor 1542 are output.

At timing 11, when the charging switches 1710, 1620, 1631 and 1741 are turned ON, and the sampling switch 130 is turned ON, the voltage current conversion section 120, the capacitor 1500, the capacitor 1520, and the capacitor 1531 are connected to each other, the charge ($Q_{120}{}^{11}$) input from the voltage current conversion section 120, the charge ($Q_{1500}{}^{10}$) charged in the capacitor 1500, and the charge ($-Q_{1520}{}^9$) charged in the capacitor 1520 are shared by the capacitor 1500, the capacitor 1520 and the capacitor 1531, and $Q_{1500}{}^{11}$ is charged in the capacitor 1500, $Q_{1520}{}^{11}$ is charged in the capacitor 1520, and $Q_{1531}{}^{11}$ is charged in the capacitor 1531. When the sampling switch 131 is turned ON, the voltage current conversion section 120, the capacitor 1501, the capacitor 1510 and the capacitor 1540 are connected to each other, the charge ($-Q_{120}{}^{11}$) input from the voltage current conversion section 120, the charge ($-Q_{1501}{}^{10}$) charged in the capacitor 1501, and the charge ($Q_{1510}{}^9$) charged in the capacitor 1510 are shared by the capacitor 1501, the capacitor 1510, and the capacitor 1541, and $-Q_{1501}{}^{11}$ is charged in the capacitor 1501, $-Q_{1510}{}^{11}$ is charged in the capacitor 1510, and $-Q_{1541}{}^{11}$ is charged in the capacitor 1541. In addition, the discharge switches 1832 and 1840 are turned ON, and the charge $Q_{1532}{}^9$ charged in the capacitor 1532 and the charge $-Q_{1540}{}^{10}$ charged in the capacitor 1540 are output.

At timing 12, when the charging switches 1711, 1621, 1632 and 1742 are turned ON, and the sampling switch 130 is turned ON, the voltage current conversion section 120, the capacitor 1500, the capacitor 1521, and the capacitor 1532 are connected to each other, the charge ($Q_{120}{}^{12}$) input from the voltage current conversion section 120, the charge ($Q_{1500}{}^{11}$) charged in the capacitor 1500, and the charge ($-Q_{1521}{}^{10}$) charged in the capacitor 1521 are shared by the capacitor 1500, the capacitor 1521 and the capacitor 1532, and $Q_{1500}{}^{12}$ is charged in the capacitor 1500, $Q_{1521}{}^{12}$ is charged in the capacitor 1521, and $Q_{1532}{}^{12}$ is charged in the capacitor 1532. When the sampling switch 131 is turned ON, the voltage current conversion section 120, the capacitor 1501, the capacitor 1511 and the capacitor 1542 are connected to each other, the charge ($-Q_{120}{}^{12}$) input from the voltage current conversion section 120, the charge ($-Q_{1501}{}^{11}$) charged in the capacitor 1501, and the charge ($Q_{1511}{}^{10}$) charged in the capacitor 1511 are shared by the capacitor 1501, the capacitor 1511, and the capacitor 1542, and $-Q_{1501}{}^{12}$ is charged in the capacitor 1501, $-Q_{1511}{}^{12}$ is charged in the capacitor 1510, and $-Q_{1542}{}^{12}$ is charged in the capacitor 1542. In addition, the discharge switches 1830 and 1841 are turned ON, and the charge $Q_{1530}{}^{10}$ charged in the capacitor 1530 and the charge $-Q_{1541}{}^{11}$ charged in the capacitor 1541 are output.

After timing 13, the timings 1 through 12 are repeated. At the respective timings, the charges shared by a plurality of capacitors are charged, and simultaneously, the charges charged in capacitors other than the plurality of capacitors are output. Where it is assumed that the capacitance of the capacitors 1500 and 1501 is $C_1$, the capacitance of the capacitors 1510, 1511, 1520 and 1521 is $C_2$, and the capacitance of the capacitors 1530, 1531, 1532, 1540, 1541 and 1542 is $C_3$, the transmission function of the sampling filter apparatus 500 may be expressed by (Expression 4).

[Mathematical Expression 4] (Expression 4)

$$\frac{y}{x} = \frac{\frac{C_3}{C_1+C_2+C_3}}{1 - \frac{C_1}{C_1+C_2+C_3}Z^{-1} + \frac{C_2}{C_1+C_2+C_3}Z^{-2}}(C_3 + C_3 Z^{-1})$$

Figure 13:
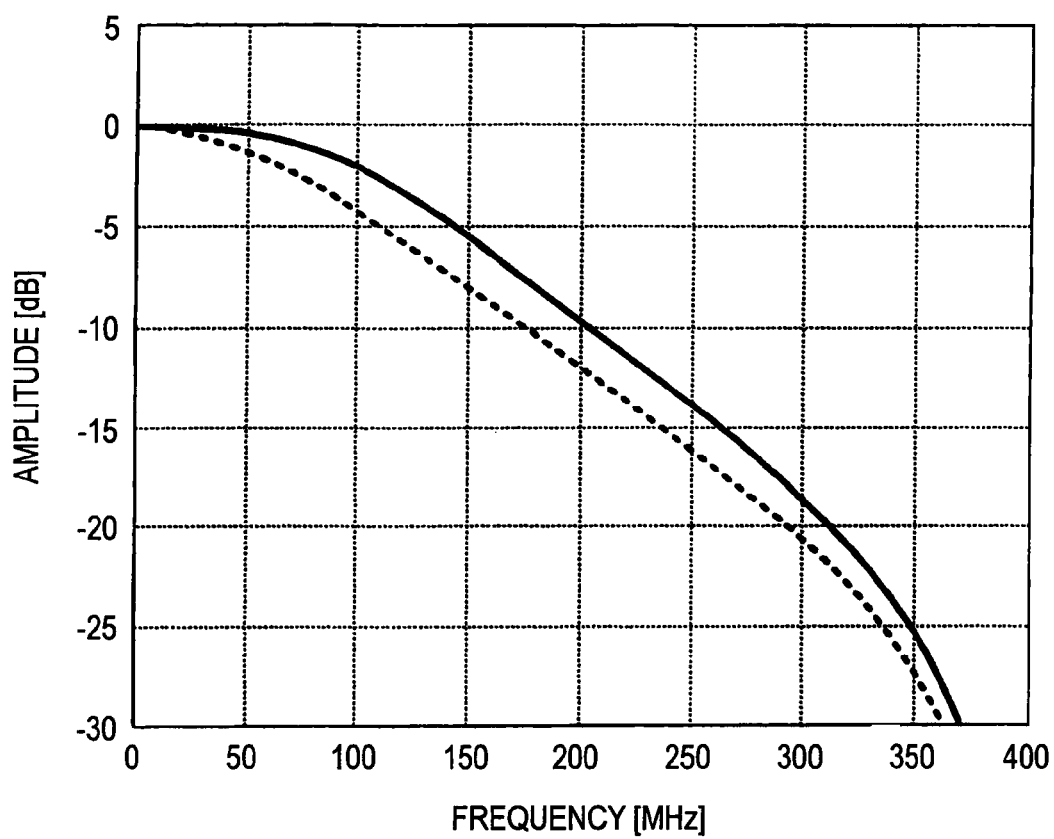
FIG. 13 is a view showing frequency characteristics in a sampling filter apparatus in Embodiment 5 according to the present invention.

The solid line of FIG. 13 shows the filtering characteristics where 1/T is 800[MHz], $C_1$ is 0.7, $C_2$ is 0.2, and $C_3$ is 0.1. Also, the dotted line thereof shows the filtering characteristics where $C_1$ is 0.75, $C_2$ is 0.15, and $C_3$ is 0.1. Thus, it is possible to vary the filtering characteristics by changing the values of $C_1$, $C_2$ and $C_3$.

According to the configuration of the present invention, a negative coefficient may be used as a transmission function of a filter, and simultaneously a high-order transmission function can be achieved. Also, a sampling filter apparatus having a wide control range of filtering characteristics can be proposed with a comparatively small circuit scale.

Further, by changing the control signals corresponding to the respective switches as in Embodiment 1, the sampling filter apparatus 500 can achieve a transmission function in which positive and negative of the coefficient of the terms of $Z^{-2}$ existing in the denominator of the transmission function expressed in (Expression 4) can be reversed, and the sampling filter apparatus 500 can be used for a wireless communication apparatus similar to Embodiments 2 and 3, and is further applied to a case of having high-order IIR filtering characteristics including the configuration of Embodiment 4.

Embodiment 6

Figure 14:
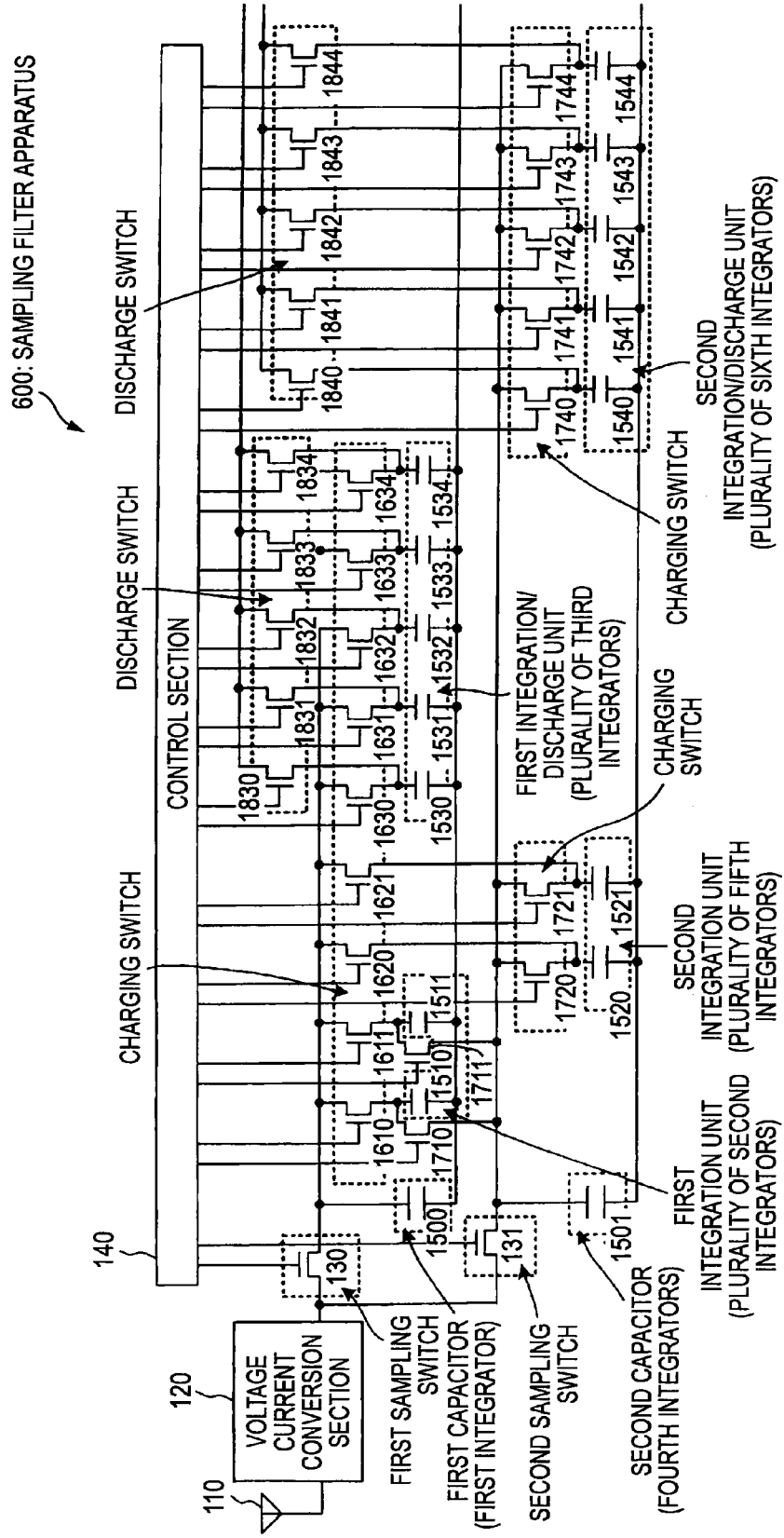
FIG. 14 is a block diagram showing a configuration of a sampling filter apparatus in Embodiment 6 according to the present invention.

FIG. 14 is a block diagram showing a configuration of a sampling filter apparatus according to Embodiment 6 of the present invention. In the present embodiment, a description is given of a case where the sampling filter apparatus is provided with second-order IIR filtering characteristics and fourth-order filtering characteristics.

In FIG. 14, the sampling filter apparatus 600 includes capacitors 1533, 1534, 1543 and 1544, charging switches 1633, 1634, 1743 and 1744, and discharge switches 1833, 1834, 1843 and 1844 in addition to the configuration described in regard to Embodiment 5. A description of the portions which are common to those of FIG. 11 of Embodiment 5 is omitted. Here, the capacitors 1533 and 1534 serve as the first integration/discharge unit, and the capacitor 1543 and 1544 serve as the second integration/discharge unit.

FIG. 15 shows control signals in regard to the respective switches. Hereinafter, a description is given of the respective timings.

At timing 1, when the charging switches 1610, 1720, 1630 and 1740 are turned ON, and the sampling switch 130 is turned ON, the voltage current conversion section 120, the capacitor 1500, the capacitor 1510, and the capacitor 1530 are connected to each other, the charge ($Q_{120}^1$) input from the voltage current conversion section 120, the charge)($Q_{1500}^0$) charged in the capacitor 1500, and the charge ($-Q_{1510}^{-1}$) charged in the capacitor 1510 are shared by the capacitor 1500, the capacitor 1510 and the capacitor 1530, and $Q_{1500}^1$ is charged in the capacitor 1500, $Q_{1510}^1$ is charged in the capacitor 1510, and $Q_{1530}^1$ is charged in the capacitor 1530. When the sampling switch 131 is turned ON, the voltage current conversion section 120, the capacitor 1501, the capacitor 1520 and the capacitor 1540 are connected to each other, the charge ($-Q_{120}^1$) input from the voltage current conversion section 120, the charge) ($-Q_{1501}^0$) charged in the capacitor 1501, and the charge ($Q_{1520}^{-1}$) charged in the capacitor 1520 are shared by the capacitor 1501, the capacitor 1520, and the capacitor 1540, and $-Q_{1501}^1$ is charged in the capacitor 1501, $-Q_{1520}^1$ is charged in the capacitor 1520, and $-Q_{1540}^1$ is charged in the capacitor 1540. In addition, the discharge switches 1831, 1832, 1843 and 1844 are turned ON, and the charge $Q_{1531}^{-3}$ charged in the capacitor 1531, the charge $Q_{1532}^{-2}$ charged in the capacitor 1532, the charge $Q_{1543}^{-1}$ in the capacitor 1543, and the charge $-Q_{1544}^0$ charged in the capacitor 1544 are output.

At timing 2, when the charging switches 1611, 1721, 1631 and 1741 are turned ON, and the sampling switch 130 is turned ON, the voltage current conversion section 120, the capacitor 1500, the capacitor 1511, and the capacitor 1531 are connected to each other, the charge ($Q_{120}^2$) input from the voltage current conversion section 120, the charge ($Q_{1500}^1$) charged in the capacitor 1500, and the charge ($-Q_{1511}^0$) charged in the capacitor 1511 are shared by the capacitor 1500, the capacitor 1511 and the capacitor 1531, and $Q_{1500}^2$ is charged in the capacitor 1500, $Q_{1511}^2$ is charged in the capacitor 1511, and $Q_{1531}^2$ is charged in the capacitor 1531. When the sampling switch 131 is turned ON, the voltage current conversion section 120, the capacitor 1501, the capacitor 1521 and the capacitor 1541 are connected to each other, the charge ($-Q_{120}^2$) input from the voltage current conversion section 120, the charge ($-Q_{1501}^1$) charged in the capacitor 1501, and the charge ($Q_{1521}^0$) charged in the capacitor 1521 are shared by the capacitor 1501, the capacitor 1521, and the capacitor 1541, and $-Q_{1501}^2$ is charged in the capacitor 1501, $-Q_{1521}^2$ is charged in the capacitor 1521, and $-Q_{1541}^2$ is charged in the capacitor 1541.

At timing 3, when the charging switches 1710, 1620, 1632 and 1742 are turned ON, and the sampling switch 130 is turned ON, the voltage current conversion section 120, the capacitor 1500, the capacitor 1520, and the capacitor 1532 are connected to each other, the charge ($Q_{120}^3$) input from the voltage current conversion section 120, the charge ($Q_{1500}^2$) charged in the capacitor 1500, and the charge ($-Q_{1520}^1$) charged in the capacitor 1520 are shared by the capacitor 1500, the capacitor 1520 and the capacitor 1532, and $Q_{1500}^3$ is charged in the capacitor 1500, $Q_{1520}^3$ is charged in the capacitor 1520, and $Q_{1532}^3$ is charged in the capacitor 1532. When the sampling switch 131 is turned ON, the voltage current conversion section 120, the capacitor 1501, the capacitor 1510 and the capacitor 1542 are connected to each other, the charge ($-Q_{120}^3$) input from the voltage current conversion section 120, the charge ($-Q_{1501}^2$) charged in the capacitor 1501, and the charge ($Q_{1510}^1$) charged in the capacitor 1510 are shared by the capacitor 1501, the capacitor 1510, and the capacitor 1542, and $-Q_{1501}^3$ is charged in the capacitor 1501, $-Q_{1510}^3$ is charged in the capacitor 1510, and $-Q_{1542}^3$ is charged in the capacitor 1542. In addition, the discharge switches 1833, 1834, 1840 and 1841 are turned ON, and the charge $Q_{1533}^{-1}$ charged in the capacitor 1533, the charge $Q_{1534}^0$ charged in the capacitor 1534, the charge $-Q_{1540}^1$ charged in the capacitor 1540, and the charge $-Q{1541}^2$ charged in the capacitor 1541 are output.

At timing 4, when the charging switches 1711, 1621, 1633 and 1743 are turned ON, and the sampling switch 130 is turned ON, the voltage current conversion section 120, the capacitor 1500, the capacitor 1521, and the capacitor 1533 are connected to each other, the charge ($Q_{120}^4$) input from the voltage current conversion section 120, the charge ($Q_{1500}^3$) charged in the capacitor 1500, and the charge ($-Q_{1521}^2$) charged in the capacitor 1521 are shared by the capacitor 1500, the capacitor 1521 and the capacitor 1533, and $Q_{1500}^4$ is charged in the capacitor 1500, $Q_{1521}^4$ is charged in the capacitor 1521, and $Q_{1533}^4$ is charged in the capacitor 1533. When the sampling switch 131 is turned ON, the voltage current conversion section 120, the capacitor 1501, the capacitor 1511 and the capacitor 1543 are connected to each other, the charge ($-Q_{120}^4$) input from the voltage current conversion section 120, the charge ($-Q_{1501}^3$) charged in the capacitor 1501, and the charge ($Q_{1511}^2$) charged in the capacitor 1511 are shared by the capacitor 1501, the capacitor 1511, and the capacitor 1543, and $-Q_{1501}^4$ is charged in the capacitor 1501, $-Q_{1511}^4$ is charged in the capacitor 1511, and $-Q_{1543}^4$ is charged in the capacitor 1543.

At timing 5, when the charging switches 1610, 1720, 1634 and 1744 are turned ON, and the sampling switch 130 is turned ON, the voltage current conversion section 120, the capacitor 1500, the capacitor 1510, and the capacitor 1534 are connected to each other, the charge ($Q_{120}^5$) input from the voltage current conversion section 120, the charge ($Q_{1500}^4$) charged in the capacitor 1500, and the charge ($-Q_{1510}^3$) charged in the capacitor 1510 are shared by the capacitor 1500, the capacitor 1510 and the capacitor 1534, and $Q_{1500}^6$ is charged in the capacitor 1500, $Q_{1510}^5$ is charged in the capacitor 1510, and $Q_{1534}^5$ is charged in the capacitor 1534. When the sampling switch 131 is turned ON, the voltage current conversion section 120, the capacitor 1501, the capacitor 1520 and the capacitor 1544 are connected to each other, the charge ($-Q_{120}^5$) input from the voltage current conversion section 120, the charge ($-Q_{1501}^4$) charged in the capacitor 1501, and the charge ($Q_{1520}^3$) charged in the capacitor 1520 are shared by the capacitor 1501, the capacitor 1520, and the capacitor 1544, and $-Q_{1501}^5$ is charged in the capacitor 1501, $-Q_{1520}^5$ is charged in the capacitor 1520, and $-Q_{1544}^5$ is charged in the capacitor 1544. In addition, the discharge switches 1830, 1831, 1842 and 1843 are turned ON, and the charge $Q_{1530}^1$ charged in the capacitor 1530, the charge $Q_{1531}^2$ charged in the capacitor 1531, the charge $-Q_{1542}^3$ charged in the capacitor 1542, and the charge $-Q_{1543}^4$ charged in the capacitor 1543 are output.

At timing 6, when the charging switches 1611, 1721, 1630 and 1740 are turned ON, and the sampling switch 130 is turned ON, the voltage current conversion section 120, the capacitor 1500, the capacitor 1511 and the capacitor 1530 are connected to each other, the charge ($Q_{120}^6$) input from the voltage current conversion section 120, the charge ($Q_{1500}^5$) charged in the capacitor 1500, and the charge ($-Q_{1511}^4$) charged in the capacitor 1511 are shared by the capacitor 1500, the capacitor 1511 and the capacitor 1530, and $Q_{1500}^6$ is charged in the capacitor 1500, $Q_{1511}^6$ is charged in the capacitor 1511, and $Q_{1530}^6$ is charged in the capacitor 1530. When the sampling switch 131 is turned ON, the voltage current conversion section 120, the capacitor 1501, the capacitor 1521 and the capacitor 1540 are connected to each other, the charge ($-Q_{120}^6$) input from the voltage current conversion section 120, the charge ($-Q_{1501}^5$) charged in the capacitor 1501, and the charge ($Q_{1521}^4$) charged in the capacitor 1521 are shared by the capacitor 1501, the capacitor 1521, and the capacitor 1540, and $-Q_{1501}^6$ is charged in the capacitor 1501, $-Q_{1521}^6$ is charged in the capacitor 1521, and $-Q_{1540}^6$ is charged in the capacitor 1540.

At timing 7, when the charging switches 1710, 1620, 1631 and 1741 are turned ON, and the sampling switch 130 is turned ON, the voltage current conversion section 120, the capacitor 1500, the capacitor 1520, and the capacitor 1531 are connected to each other, the charge ($Q_{120}^7$) input from the voltage current conversion section 120, the charge ($Q_{1500}^6$) charged in the capacitor 1500, and the charge ($-Q_{1520}^5$) charged in the capacitor 1520 are shared by the capacitor 1500, the capacitor 1520 and the capacitor 1531, and $Q_{1500}^7$ is charged in the capacitor 1500, $Q_{1520}^7$ is charged in the capacitor 1520, and $Q_{1531}^7$ is charged in the capacitor 1531. When the sampling switch 131 is turned ON, the voltage current conversion section 120, the capacitor 1501, the capacitor 1510 and the capacitor 1541 are connected to each other, the charge ($-Q_{120}^7$) input from the voltage current conversion section 120, the charge ($-Q_{1501}^6$) charged in the capacitor 1501, and the charge ($Q_{1510}^5$) charged in the capacitor 1510 are shared by the capacitor 1501, the capacitor 1510, and the capacitor 1541, and $-Q_{1501}^7$ is charged in the capacitor 1501, $-Q_{1510}^7$ is charged in the capacitor 1510, and $-Q_{1541}^7$ is charged in the capacitor 1541. In addition, the discharge switches 1832, 1833, 1844 and 1840 are turned ON, and the charge $Q_{1532}^3$ charged in the capacitor 1532, the charge $Q_{1533}^4$ charged in the capacitor 1533, the charge $-Q_{1544}^5$ charged in the capacitor 1544, and the charge $-Q1540^6$ charged in the capacitor 1540 are output.

At timing 8, when the charging switches 1711, 1621, 1632 and 1742 are turned ON, and the sampling switch 130 is turned ON, the voltage current conversion section 120, the capacitor 1500, the capacitor 1521 and the capacitor 1532 are connected to each other, the charge ($Q_{120}^8$) input from the voltage current conversion section 120, the charge ($Q_{1500}^7$) charged in the capacitor 1500, and the charge ($-Q_{1521}^6$) charged in the capacitor 1521 are shared by the capacitor 1500, the capacitor 1521 and the capacitor 1532, and $Q_{1500}^8$ is charged in the capacitor 1500, $Q_{1521}^8$ is charged in the capacitor 1521, and $Q_{1532}^8$ is charged in the capacitor 1532. When the sampling switch 131 is turned ON, the voltage current conversion section 120, the capacitor 1501, the capacitor 1511 and the capacitor 1542 are connected to each other, the charge ($-Q_{120}^8$) input from the voltage current conversion section 120, the charge ($-Q_{1501}^7$) charged in the capacitor 1501, and the charge ($Q_{1511}^6$) charged in the capacitor 1511 are shared by the capacitor 1501, the capacitor 1511, and the capacitor 1542, and $-Q_{1501}^8$ is charged in the capacitor 1501, $-Q_{1511}^8$ is charged in the capacitor 1511, and $-Q_{1542}^8$ is charged in the capacitor 1542.

At timing 9, when the charging switches 1610, 1720, 1633 and 1743 are turned ON, and the sampling switch 130 is turned ON, the voltage current conversion section 120, the capacitor 1500, the capacitor 1510, and the capacitor 1533 are connected to each other, the charge ($Q_{120}^9$) input from the voltage current conversion section 120, the charge ($Q_{1500}^8$) charged in the capacitor 1500, and the charge ($-Q_{1510}^7$) charged in the capacitor 1510 are shared by the capacitor 1500, the capacitor 1510 and the capacitor 1533, and $Q_{1500}^9$ is charged in the capacitor 1500, $Q_{1510}^9$ is charged in the capacitor 1510, and $Q_{1533}^9$ is charged in the capacitor 1533. When the sampling switch 131 is turned ON, the voltage current conversion section 120, the capacitor 1501, the capacitor 1520 and the capacitor 1543 are connected to each other, the charge ($-Q_{120}^9$) input from the voltage current conversion section 120, the charge ($-Q_{1501}^8$) charged in the capacitor 1501, and the charge ($Q_{1520}^7$) charged in the capacitor 1520 are shared by the capacitor 1501, the capacitor 1520, and the capacitor 1543, and $-Q_{1501}^9$ is charged in the capacitor 1501, $-Q_{1520}^9$ is charged in the capacitor 1520, and $-Q_{1543}^9$ is charged in the capacitor 1543. In addition, the discharge switches 1834, 1830, 1841 and 1842 are turned ON, and the charge $Q_{1534}^5$ charged in the capacitor 1534, the charge $Q1530^6$ charged in the capacitor 1530, the charge $-Q_{1541}^7$ charged in the capacitor 1541, and the charge $-Q_{1542}^8$ charged in the capacitor 1542 are output.

At timing 10, when the charging switches 1611, 1721, 1634 and 1744 are turned ON, and the sampling switch 130 is turned ON, the voltage current conversion section 120, the capacitor 1500, the capacitor 1511 and the capacitor 1534 are connected to each other, the charge ($Q_{120}^{10}$) input from the voltage current conversion section 120, the charge ($Q_{1500}^9$) charged in the capacitor 1500, and the charge ($-Q_{1511}^8$) charged in the capacitor 1511 are shared by the capacitor 1500, the capacitor 1511 and the capacitor 1534, and $Q_{1500}^{10}$ is charged in the capacitor 1500, $Q_{1511}^{10}$ is charged in the capacitor 1511, and $Q_{1534}^{10}$ is charged in the capacitor 1534. When the sampling switch 131 is turned ON, the voltage current conversion section 120, the capacitor 1501, the capacitor 1521 and the capacitor 1544 are connected to each other, the charge ($-Q_{120}^{10}$) input from the voltage current conversion section 120, the charge ($-Q_{1501}^9$) charged in the capacitor 1501, and the charge ($Q_{1521}^8$) charged in the capacitor 1521 are shared by the capacitor 1501, the capacitor 1521, and the capacitor 1544, and $-Q_{1501}^{10}$ is charged in the capacitor 1501, $-Q_{1521}^{10}$ is charged in the capacitor 1521, and $-Q_{1544}^{10}$ is charged in the capacitor 1544.

At timing 11, when the charging switches 1710, 1620, 1630 and 1740 are turned ON, and the sampling switch 130 is turned ON, the voltage current conversion section 120, the capacitor 1500, the capacitor 1520, and the capacitor 1530 are connected to each other, the charge ($Q_{120}^{11}$) input from the voltage current conversion section 120, the charge ($Q_{1500}^{10}$) charged in the capacitor 1500, and the charge ($-Q_{1520}^9$) charged in the capacitor 1520 are shared by the capacitor 1500, the capacitor 1520 and the capacitor 1530, and $Q_{1500}^{11}$ is charged in the capacitor 1500, $Q_{1520}^{11}$ is charged in the capacitor 1520, and $Q_{1530}^{11}$ is charged in the capacitor 1530. When the sampling switch 131 is turned ON, the voltage current conversion section 120, the capacitor 1501, the capacitor 1510 and the capacitor 1540 are connected to each other, the charge ($-Q_{120}^{11}$) input from the voltage current conversion section 120, the charge ($-Q_{1501}^{10}$) charged in the capacitor 1501, and the charge ($Q_{1510}^9$) charged in the capacitor 1510 are shared by the capacitor 1501, the capacitor 1510, and the capacitor 1540, and $-Q_{1501}^{11}$ is charged in the capacitor 1501, $-Q_{1510}^{11}$ is charged in the capacitor 1510, and $-Q_{1540}^{11}$ is charged in the capacitor 1540. In addition, the discharge switches 1831, 1832, 1843 and 1844 are turned ON, and the charge $Q_{1531}^{7}$ charged in the capacitor 1531, the charge $Q_{1532}^{8}$ charged in the capacitor 1532, the charge $-Q_{1543}^{9}$ charged in the capacitor 1543, and the charge $-Q_{1544}^{10}$ charged in the capacitor 1544 are output.

At timing 12, when the charging switches 1711, 1621, 1631 and 1741 are turned ON, and the sampling switch 130 is turned ON, the voltage current conversion section 120, the capacitor 1500, the capacitor 1521 and the capacitor 1531 are connected to each other, the charge $(Q_{120}^{12})$ input from the voltage current conversion section 120, the charge $(Q_{1500}^{11})$ charged in the capacitor 1500, and the charge $(-Q_{1521}^{10})$ charged in the capacitor 1521 are shared by the capacitor 1500, the capacitor 1521 and the capacitor 1531, and $Q_{1500}^{12}$ is charged in the capacitor 1500, $Q_{1521}^{12}$ is charged in the capacitor 1521, and $Q_{1531}^{12}$ is charged in the capacitor 1531. When the sampling switch 131 is turned ON, the voltage current conversion section 120, the capacitor 1501, the capacitor 1511 and the capacitor 1541 are connected to each other, the charge $(-Q_{120}^{12})$ input from the voltage current conversion section 120, the $(-Q_{1501}^{11})$ charged in the capacitor 1501, and the charge $(Q_{1511}^{10})$ charged in the capacitor 1511 are shared by the capacitor 1501, the capacitor 1511, and the capacitor 1541, and $-Q_{1501}^{12}$ is charged in the capacitor 1501, $-Q_{1511}^{12}$ is charged in the capacitor 1511, and $-Q_{1541}^{12}$ is charged in the capacitor 1541.

At timing 13, when the charging switches 1610, 1720, 1632 and 1742 are turned ON, and the sampling switch 130 is turned ON, the voltage current conversion section 120, the capacitor 1500, the capacitor 1510, and the capacitor 1532 are connected to each other, the charge $(Q_{120}^{13})$ input from the voltage current conversion section 120, the charge $(Q_{1500}^{12})$ charged in the capacitor 1500, and the charge $(-Q_{1510}^{11})$ charged in the capacitor 1510 are shared by the capacitor 1500, the capacitor 1510 and the capacitor 1532, and $Q_{1500}^{13}$ is charged in the capacitor 1500, $Q_{1510}^{13}$ is charged in the capacitor 1510, and $Q1532^{13}$ is charged in the capacitor 1532. When the sampling switch 131 is turned ON, the voltage current conversion section 120, the capacitor 1501, the capacitor 1520 and the capacitor 1542 are connected to each other, the charge $(-Q_{120}^{13})$ input from the voltage current conversion section 120, the charge $(-Q_{1501}^{12})$ charged in the capacitor 1501, and the charge $(Q_{1520}^{11})$ charged in the capacitor 1520 are shared by the capacitor 1501, the capacitor 1520, and the capacitor 1542, and $-Q_{1501}^{13}$ is charged in the capacitor 1501, $-Q_{1520}^{13}$ is charged in the capacitor 1520, and $-Q_{1542}^{13}$ is charged in the capacitor 1542. In addition, the discharge switches 1833, 1834, 1840 and 1841 are turned ON, and the charge $Q1533^{9}$ charged in the capacitor 1533, the charge $Q_{1534}^{10}$ charged in the capacitor 1534, the charge $-Q_{1540}^{11}$ charged in the capacitor 1540, and the charge $-Q_{1541}^{12}$ charged in the capacitor 1541 are output.

At timing 14, when the charging switches 1611, 1721, 1633 and 1743 are turned ON, and the sampling switch 130 is turned ON, the voltage current conversion section 120, the capacitor 1500, the capacitor 1511 and the capacitor 1533 are connected to each other, the charge $(Q_{120}^{14})$ input from the voltage current conversion section 120, the charge $(Q_{1500}^{13})$ charged in the capacitor 1500, and the charge $(-Q_{1511}^{12})$ charged in the capacitor 1511 are shared by the capacitor 1500, the capacitor 1511 and the capacitor 1533, and $Q_{1500}^{14}$ is charged in the capacitor 1500, $Q_{1511}^{14}$ is charged in the capacitor 1511, and $Q_{1533}^{14}$ is charged in the capacitor 1533. When the sampling switch 131 is turned ON, the voltage current conversion section 120, the capacitor 1501, the capacitor 1521 and the capacitor 1543 are connected to each other, the charge $(-Q_{120}^{14})$ input from the voltage current conversion section 120, the charge $(-Q_{1501}^{13})$ charged in the capacitor 1501, and the charge $(Q_{1521}^{12})$ charged in the capacitor 1521 are shared by the capacitor 1501, the capacitor 1521, and the capacitor 1543, and $-Q_{1501}^{14}$ is charged in the capacitor 1501, $-Q_{1521}^{14}$ is charged in the capacitor 1521, and $-Q_{1543}^{14}$ is charged in the capacitor 1543.

At timing 15, when the charging switches 1710, 1620, 1634 and 1744 are turned ON, and the sampling switch 130 is turned ON, the voltage current conversion section 120, the capacitor 1500, the capacitor 1520, and the capacitor 1534 are connected to each other, the charge $(Q_{120}^{15})$ input from the voltage current conversion section 120, the charge $(Q_{1500}^{14})$ charged in the capacitor 1500, and the charge $(-Q_{1520}^{13})$ charged in the capacitor 1520 are shared by the capacitor 1500, the capacitor 1520 and the capacitor 1534, and $Q_{1500}^{15}$ is charged in the capacitor 1500, $Q_{1520}^{15}$ is charged in the capacitor 1520, and $Q_{1534}^{15}$ is charged in the capacitor 1534. When the sampling switch 131 is turned ON, the voltage current conversion section 120, the capacitor 1501, the capacitor 1510 and the capacitor 1544 are connected to each other, the charge $(-Q_{120}^{15})$ input from the voltage current conversion section 120, the charge $(-Q_{1501}^{14})$ charged in the capacitor 1501, and the charge $(Q_{1510}^{13})$ charged in the capacitor 1510 are shared by the capacitor 1501, the capacitor 1510, and the capacitor 1544, and $-Q_{1501}^{15}$ is charged in the capacitor 1501, $-Q_{1510}^{15}$ is charged in the capacitor 1510, and $-Q_{1544}^{15}$ is charged in the capacitor 1544. In addition, the discharge switches 1830, 1831, 1842 and 1843 are turned ON, and the charge $Q_{1530}^{11}$ charged in the capacitor 1530, the charge $Q_{1531}^{12}$ charged in the capacitor 1531, the charge $-Q_{1542}^{13}$ charged in the capacitor 1542, and the charge $-Q_{1543}^{14}$ charged in the capacitor 1543 are output.

At timing 16, when the charging switches 1711, 1621, 1630 and 1740 are turned ON, and the sampling switch 130 is turned ON, the voltage current conversion section 120, the capacitor 1500, the capacitor 1521 and the capacitor 1530 are connected to each other, the charge $(Q_{120}^{16})$ input from the voltage current conversion section 120, the charge $(Q_{1500}^{15})$ charged in the capacitor 1500, and the charge $(-Q_{1521}^{14})$ charged in the capacitor 1521 are shared by the capacitor 1500, the capacitor 1521 and the capacitor 1530, and $Q_{1500}^{16}$ is charged in the capacitor 1500, $Q_{1521}^{16}$ is charged in the capacitor 1521, and $Q_{1530}^{16}$ is charged in the capacitor 1530. When the sampling switch 131 is turned ON, the voltage current conversion section 120, the capacitor 1501, the capacitor 1511 and the capacitor 1540 are connected to each other, the charge $(-Q_{120}^{16})$ input from the voltage current conversion section 120, the charge $(-Q_{1501}^{15})$ charged in the capacitor 1501, and the charge $(Q_{1511}^{14})$ charged in the capacitor 1511 are shared by the capacitor 1501, the capacitor 1511, and the capacitor 1540, and $-Q_{1501}^{16}$ is charged in the capacitor 1501, $-Q_{1511}^{16}$ is charged in the capacitor 1511, and $-Q_{1540}^{16}$ is charged in the capacitor 1540.

At timing 17, when the charging switches 1610, 1720, 1631 and 1741 are turned ON, and the sampling switch 130 is turned ON, the voltage current conversion section 120, the capacitor 1500, the capacitor 1510, and the capacitor 1531 are connected to each other, the charge $(Q_{120}^{17})$ input from the voltage current conversion section 120, the charge $(Q_{1500}^{16})$ charged in the capacitor 1500, and the charge $(-Q_{1510}^{15})$ charged in the capacitor 1510 are shared by the capacitor 1500, the capacitor 1510 and the capacitor 1531, and $Q_{1500}^{17}$ is charged in the capacitor 1500, $Q_{1510}^{17}$ is charged in the capacitor 1510, and $Q_{1531}^{17}$ is charged in the capacitor 1531. When the sampling switch 131 is turned ON, the voltage current conversion section 120, the capacitor 1501, the capacitor 1520 and the capacitor 1541 are connected to each other, the charge ($-Q_{120}^{17}$) input from the voltage current conversion section 120, the charge ($-Q_{1501}^{16}$) charged in the capacitor 1501, and the charge ($Q_{1520}^{15}$) charged in the capacitor 1520 are shared by the capacitor 1501, the capacitor 1520, and the capacitor 1541, and $-Q_{1501}^{17}$ is charged in the capacitor 1501, $-Q_{1520}^{17}$ is charged in the capacitor 1520, and $-Q_{1541}^{17}$ is charged in the capacitor 1541. In addition, the discharge switches 1832, 1833, 1844 and 1840 are turned ON, and the charge $Q_{1532}^{13}$ charged in the capacitor 1532, the charge $Q_{1533}^{14}$ charged in the capacitor 1533, the charge $-Q_{1544}^{15}$ charged in the capacitor 1544, and the charge $-Q_{1540}^{16}$ charged in the capacitor 1540 are output.

At timing 18, when the charging switches 1611, 1721, 1632 and 1742 are turned ON, and the sampling switch 130 is turned ON, the voltage current conversion section 120, the capacitor 1500, the capacitor 1511 and the capacitor 1532 are connected to each other, the charge ($Q_{120}^{18}$) input from the voltage current conversion section 120, the charge ($Q_{1500}^{17}$) charged in the capacitor 1500, and the charge ($-Q_{1511}^{16}$) charged in the capacitor 1511 are shared by the capacitor 1500, the capacitor 1511 and the capacitor 1532, and $Q_{1500}^{18}$ is charged in the capacitor 1500, $Q_{1511}^{18}$ is charged in the capacitor 1511, and $Q_{1532}^{18}$ is charged in the capacitor 1532. When the sampling switch 131 is turned ON, the voltage current conversion section 120, the capacitor 1501, the capacitor 1521 and the capacitor 1542 are connected to each other, the charge ($-Q_{120}^{18}$) input from the voltage current conversion section 120, the charge ($-Q_{1501}^{17}$) charged in the capacitor 1501, and the charge ($Q_{1521}^{16}$) charged in the capacitor 1521 are shared by the capacitor 1501, the capacitor 1521, and the capacitor 1542, and $-Q_{1501}^{18}$ is charged in the capacitor 1501, $-Q_{1521}^{18}$ is charged in the capacitor 1521, and $-Q_{1542}^{18}$ is charged in the capacitor 1542.

At timing 19, when the charging switches 1710, 1620, 1633 and 1743 are turned ON, and the sampling switch 130 is turned ON, the voltage current conversion section 120, the capacitor 1500, the capacitor 1520 and the capacitor 1533 are connected to each other, the charge ($Q_{120}^{19}$) input from the voltage current conversion section 120, the charge ($Q_{1500}^{18}$) charged in the capacitor 1500, and the charge ($-Q_{1520}^{17}$) charged in the capacitor 1520 are shared by the capacitor 1500, the capacitor 1520 and the capacitor 1533, and $Q_{1500}^{19}$ is charged in the capacitor 1500, $Q_{1520}^{19}$ is charged in the capacitor 1520, and $Q_{1533}^{19}$ is charged in the capacitor 1533. When the sampling switch 131 is turned ON, the voltage current conversion section 120, the capacitor 1501, the capacitor 1510 and the capacitor 1543 are connected to each other, the charge ($-Q_{120}^{19}$) input from the voltage current conversion section 120, the charge ($-Q_{1501}^{18}$) charged in the capacitor 1501, and the charge ($Q_{1510}^{17}$) charged in the capacitor 1510 are shared by the capacitor 1501, the capacitor 1510, and the capacitor 1543, and $-Q_{1501}^{19}$ is charged in the capacitor 1501, $-Q_{1510}^{19}$ is charged in the capacitor 1510, and $-Q_{1543}^{19}$ is charged in the capacitor 1543. In addition, the discharge switches 1834, 1830, 1841 and 1842 are turned ON, and the charge $Q_{1534}^{15}$ charged in the capacitor 1534, the charge $Q_{1530}^{16}$ charged in the capacitor 1530, the charge $-Q_{1541}^{17}$ charged in the capacitor 1541, and the charge $-Q_{1542}^{18}$ charged in the capacitor 1542 are output.

At timing 20, when the charging switches 1711, 1621, 1634 and 1744 are turned ON, and the sampling switch 130 is turned ON, the voltage current conversion section 120, the capacitor 1500, the capacitor 1521 and the capacitor 1534 are connected to each other, the charge ($Q_{120}^{20}$) input from the voltage current conversion section 120, the charge ($Q_{1500}^{19}$) charged in the capacitor 1500, and the charge ($-Q_{1521}^{18}$) charged in the capacitor 1521 are shared by the capacitor 1500, the capacitor 1521 and the capacitor 1534, and $Q_{1500}^{20}$ is charged in the capacitor 1500, $Q_{1521}^{20}$ is charged in the capacitor 1521, and $Q_{1534}^{20}$ is charged in the capacitor 1534. When the sampling switch 131 is turned ON, the voltage current conversion section 120, the capacitor 1501, the capacitor 1511 and the capacitor 1544 are connected to each other, the charge ($-Q_{120}^{20}$) input from the voltage current conversion section 120, the charge ($-Q_{1501}^{19}$) charged in the capacitor 1501, and the charge ($Q_{1511}^{18}$) charged in the capacitor 1511 are shared by the capacitor 1501, the capacitor 1511, and the capacitor 1544, and $-Q_{1501}^{20}$ is charged in the capacitor 1501, $-Q_{1511}^{20}$ is charged in the capacitor 1511, and $-Q_{1544}^{20}$ is changed in the capacitor 1544.

After timing 21, the timings 1 through 20 are repeated. At the respective timings, the charge shared by a plurality of capacitors is charged, and the charge charged in capacitors other than the plurality of capacitors is output, skipping the timing one by one. In the case of having fourth-order FIR filtering characteristics, since the timing at which the charge is output is one by two charging timings, the characteristics are decimated by two. Where it is assumed that the capacitance of the capacitors 1500 and 1501 is C1, the capacitance of the capacitors 1510, 1511, 1520 and 1521 is C2, and the capacitance of the capacitors 1530, 1531, 1532, 1533, 1534, 1540, 1541, 1542, 1543 and 1544 is C3, the transmission function of the sampling filter apparatus 600 may be expressed by (Expression 5).

[0142] [Mathematical Expression 5] (Expression 5)

$$\frac{y}{x} = \frac{\frac{C_3}{C_1+C_2+C_3}}{1 - \frac{C_1}{C_1+C_2+C_3}Z^{-1} + \frac{C_2}{C_1+C_2+C_3}Z^{-2}}\left(\begin{array}{c}C_3 + C_3 Z^{-1} + \\ C_3 Z^{-2} + C_3 Z^{-3}\end{array}\right)$$

According to the configuration of the present invention, a sampling filter apparatus, which is capable of using a negative coefficient as a transmission function of a filter, simultaneously achieving a high-order transmission function, and has a wide control range of filtering characteristics, can be proposed with a comparatively small circuit scale.

In addition, in the sampling filter apparatus 600, by changing the control signals corresponding to the respective switches as in Embodiment 1, the sampling filter apparatus 600 can achieve a transmission function in which positive and negative of the coefficient of the term of $Z^{-2}$ existing in the denominator of the transmission function expressed in (Expression 5) can be reversed, and the sampling filter apparatus 600 can be used for a wireless communication apparatus similar to Embodiments 2 and 3, and may also be applicable to a case of having high-order IIR filtering characteristics including the configuration of Embodiment 4.

Further, although, in the present invention, a description was given of a case of having second-order FIR filtering characteristics in Embodiment 5 and a case of having fourth-order FIR filtering characteristics in Embodiment 6, it is possible to configure a sampling filter apparatus having still further high-order FIR filtering characteristics by including more capacitors and charging switches.

Although a detailed description was given of the present invention with reference to specified embodiments, it is obvious to one skilled in the art that the invention can be subjected to various modifications and variations without departing from the spirit and scope of the invention.

The present application is based on Japanese Patent Application (Japanese Patent Application No. 2007-252367) filed on Sep. 27, 2007, and the description thereof is included herein as reference.

INDUSTRIAL APPLICABILITY

The present invention has an effect of providing a sampling filter apparatus having a wide control range of filtering characteristics by achieving high-order filtering characteristics including a negative coefficient as a transmission function of a filter, and is useful as a filter in an analog circuit of a wireless communication apparatus.

What is claimed is:

1. A sampling filter apparatus, comprising:
a first sampling switch that samples an input current;
a second sampling switch that is difference in phase of ON timing by 180 degrees from the first sampling switch;
a first integrator that integrates a charge input from the first sampling switch;
a plurality of third integrators;
a plurality of second integrators that integrate a charge input from the second sampling switch;
charging switches connected to the second integrators;
charging switches and discharge switches connected to the third integrators; and
a control section that controls the respective switches,
wherein the sampling filter apparatus controls so that the charge input from the first sampling switch, a charge accumulated in the first integrator and a charge accumulated in the second integrator are shared by the first integrator, the second integrator and the third integrator, and the charges accumulated in the third integrators are output.

2. The sampling filter apparatus according to claim 1, further comprising:
a fourth integrator that integrates a charge input from the second sampling switch;
a plurality of sixth integrators; and
a plurality of fifth integrators that integrate a charge input from the first sampling switch,
wherein the charge input from the second sampling switch, a charge accumulated in the fourth integrator and a charge accumulated in the fifth integrator are shared by the fourth integrator, the fifth integrator and the sixth integrator, and an output from the sixth integrator and an output from the third integrator are differentially composed.

3. The sampling filter apparatus according to claim 1, wherein the sampling filter apparatus controls so that the second integrator integrates the charge input from the first sampling switch and the fifth integrator integrates the charge input from the second sampling switch.

4. A wireless communication apparatus, comprising:
the sampling filter apparatus according to claim 1;
a buffer section that converts the charge output from the inside of the sampling filter apparatus to a voltage value and outputs the converted voltage value;
an A/D section that digitalizes an analog signal output from the buffer section; and
a base band section that demodulates the signal digitalized by the A/D section.

5. A sampling filter apparatus, comprising:
a first sampling switch that outputs a positive charge by sampling an input current;
a second sampling switch that outputs a negative charge by sampling an input current;
a first capacitor that integrates the positive charge input from the first sampling switch;
a second capacitor that integrates the negative charge input from the second sampling switch;
a first integration unit having a plurality of capacitors that is connected to both of the first capacitor and the second capacitor via a charging switch;
a second integration unit having a plurality of capacitors that is connected to both of the first capacitor and the second capacitor via a charging switch;
a first integration/discharge unit having a plurality of capacitors that is connected to the first capacitor via a charging switch;
a second integration/discharge unit having a plurality of capacitors that is connected to the second capacitor via a charging switch;
a discharge switch that discharges the charges accumulated in the first integration/discharge unit and the second integration/discharge unit; and
a control section that generates signals to control the first sampling switch, the second sampling switch, the charging switch, and the discharge switch, respectively,
wherein a signal for controlling the first sampling switch is different in phase by 180 degrees from a signal for controlling the second sampling switch;
wherein the charge input from the first sampling switch, the charge already accumulated in the first capacitor, and the charge already accumulated in at least one capacitor selected from the plurality of capacitors included in the first and the second integration units are shared by the first capacitor, the selected at least one capacitor, and at least one capacitor included in the first integration/discharge unit; and
wherein a charge accumulated in a capacitor differing from the capacitor sharing the charge among the plurality of capacitors included in the first integration/discharge unit and the charge accumulated in at least one capacitor included in the second integration/discharge unit are composed at the same timing as the sharing of the charge, and the composed charge is output via the discharge switch.

6. The sampling filter apparatus according to claim 5, wherein the charge input from the second sampling switch, the charge already accumulated in the second capacitor and the charge already accumulated in the at least one capacitor selected from the plurality of capacitors included in the first and the second integration units are shared by the second capacitor, the selected at least one capacitor, and the at least one capacitor included in the second integration/discharge unit; and
wherein a charge accumulated in a capacitor differing from the capacitor sharing the charge among the plurality of capacitors included in the second integration/discharge unit and the charge accumulated in at least one capacitor included in the first integration/discharge unit are composed at the same timing as the sharing of the charge, and the composed charge is output via the discharge switch.

7. The sampling filter apparatus according to claim 5, wherein sharing and composition of the charges are repeated while varying combinations of capacitors connected to the first capacitor and the second capacitor at respective timings.

8. The sampling filer apparatus according to claim 5, wherein, at the timing of sharing of the charge, where a charge already accumulated in at least one capacitor selected from the plurality of capacitors included in the first and the second integration units is a positive charge, the charging switch is controlled so that the selected capacitor is connected to the second capacitor, and where the charge already accumulated in the at least one capacitor selected from the plurality of capacitors included in the first and the second integration units is a negative charge, the charging switch is controlled so that the selected capacitor is connected to the first integrator.

9. A wireless communication apparatus, comprising:
the sampling filter apparatus according to claim 5;
a buffer section that converts the charge output from the inside of the sampling filter apparatus to a voltage value and outputs the converted voltage value;
an A/D section that digitalizes an analog signal output from the buffer section; and
a base band section that demodulates the signal digitalized by the A/D section.

10. A sampling filter apparatus, comprising:
a first sampling switch that outputs a positive charge by sampling an input current;
a second sampling switch that outputs a negative charge by sampling an input current;
a first capacitor that integrates the positive charge input from the first sampling switch;
a second capacitor that integrates the negative charge input from the second sampling switch;
a first integration unit having a plurality of capacitors that is connected to both of the first capacitor and the second capacitor via a charging switch;
a second integration unit having a plurality of capacitors that is connected to both of the first capacitor and the second capacitor via a charging switch;
a first integration/discharge unit having a plurality of capacitors that is connected to the first capacitor via a charging switch;
a second integration/discharge unit having a plurality of capacitors that is connected to the second capacitor via a charging switch;
a discharge switch that discharges the charges accumulated in the first integration/discharge unit and the second integration/discharge unit; and
a control section that generates signals to control the first sampling switch, the second sampling switch, the charging switch, and the discharge switch, respectively;
wherein a signal for controlling the first sampling switch is different in phase by 180 degrees from a signal for controlling the second sampling switch;
wherein the charge input from the first sampling switch, the charge already accumulated in the first capacitor, and the charge already accumulated in at least one capacitor selected from the plurality of capacitors included in the first and the second integration units are shared by the first capacitor, the selected at least one capacitor, and at least one capacitor included in the first integration/discharge unit; and
wherein a charge accumulated in at least one capacitor among the plurality of capacitors which are included in the first integration/discharge unit and are different from the capacitors sharing the charge and a charge accumulated in at least one capacitor included in the second integration/discharge unit are composed, and the composed charge is output via the discharge switch.

11. The sampling filter apparatus according to claim 10, wherein the charge input from the second sampling switch, the charge already accumulated in the second capacitor, and a charge already accumulated in at least one capacitor selected from the plurality of capacitors included in the first and the second integration units are shared by the second capacitor, the selected at least one capacitor, and at least one capacitor included in the second integration/discharge unit; and
wherein a charge accumulated in at least one capacitor among the plurality of capacitors included in the second integration/discharge unit and are different from the capacitors sharing the charge and a charge accumulated in at least one capacitor included in the first integration/discharge unit are composed, and the composed charge is output via the discharge switch.

12. The sampling filter apparatus according to claim 10, wherein the charge is output at a timing thinning the timings sharing the charge.

* * * * *